(12) United States Patent
Ni et al.

(10) Patent No.: US 10,861,938 B2
(45) Date of Patent: Dec. 8, 2020

(54) SEMICONDUCTOR DEVICE AND METHOD OF MANUFACTURING THE SAME

(71) Applicant: NISSAN MOTOR CO., LTD., Yokohama (JP)

(72) Inventors: Wei Ni, Kanagawa (JP); Tetsuya Hayashi, Kanagawa (JP); Toshiharu Marui, Kanagawa (JP); Yuji Saito, Kanagawa (JP); Kenta Emori, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 94 days.

(21) Appl. No.: 14/905,648

(22) PCT Filed: Jun. 3, 2014

(86) PCT No.: PCT/JP2014/064678
§ 371 (c)(1),
(2) Date: Jan. 15, 2016

(87) PCT Pub. No.: WO2015/008550
PCT Pub. Date: Jan. 22, 2015

(65) Prior Publication Data
US 2016/0181371 A1 Jun. 23, 2016

(30) Foreign Application Priority Data
Jul. 19, 2013 (JP) ................................. 2013-150408

(51) Int. Cl.
*H01L 29/15* (2006.01)
*H01L 29/10* (2006.01)
(Continued)

(52) U.S. Cl.
CPC ...... *H01L 29/1095* (2013.01); *H01L 21/0475* (2013.01); *H01L 21/26586* (2013.01);
(Continued)

(58) Field of Classification Search
CPC ............. H01L 21/0475; H01L 29/0865; H01L 29/0882; H01L 29/1095; H01L 29/1608;
(Continued)

(56) References Cited

U.S. PATENT DOCUMENTS

| | | | | |
|---|---|---|---|---|
| 4,422,089 A | * | 12/1983 | Vaes | ...................... H01L 29/063 257/272 |
| 4,819,045 A | * | 4/1989 | Murakami | ...... H01L 21/823857 257/371 |

(Continued)

FOREIGN PATENT DOCUMENTS

JP 2001-274398 A 10/2001

OTHER PUBLICATIONS

Nakagawa, A., et al., "Improved 20V Lateral Trench Gate Power MOSFETs With Very Low On-Resistance of 7.8 Momegamm", ISPSD 2000, May 22-25, 2000, Toulouse, France, pp. 47-50, 20000522.

*Primary Examiner* — Jay C Kim
(74) *Attorney, Agent, or Firm* — Young Basile Hanlon & MacFarlane, P.C.

(57) ABSTRACT

The semiconductor device includes: a substrate, an n-type drift region formed on a main surface of the substrate; a p-type well region, an n-type drain region and an n-type source region each formed in the drift region to extend from a second main surface of the drift region opposite to the first main surface of the drift region in contact with the substrate in a direction perpendicular to the second main surface; a gate groove extending from the second main surface in the perpendicular direction and penetrating the source region and the well region in a direction parallel to the first main surface of the substrate; and a gate electrode formed on a surface of the gate groove with a gate insulating film interposed therebetween, wherein the drift region has a (Continued)

higher impurity concentration than the substrate, and the well region extends to the inside of the substrate.

15 Claims, 30 Drawing Sheets

(51) Int. Cl.
  H01L 21/84       (2006.01)
  H01L 27/12       (2006.01)
  H01L 29/66       (2006.01)
  H01L 29/423      (2006.01)
  H01L 29/417      (2006.01)
  H01L 29/78       (2006.01)
  H01L 21/04       (2006.01)
  H01L 21/265      (2006.01)
  H01L 21/306      (2006.01)
  H01L 29/08       (2006.01)
  H01L 29/16       (2006.01)

(52) U.S. Cl.
  CPC ........ *H01L 21/30604* (2013.01); *H01L 21/84* (2013.01); *H01L 27/1203* (2013.01); *H01L 29/41766* (2013.01); *H01L 29/4236* (2013.01); *H01L 29/66068* (2013.01); *H01L 29/66696* (2013.01); *H01L 29/66704* (2013.01); *H01L 29/7816* (2013.01); *H01L 29/7825* (2013.01); *H01L 29/7835* (2013.01); *H01L 21/047* (2013.01); *H01L 29/0865* (2013.01); *H01L 29/0882* (2013.01); *H01L 29/1608* (2013.01)

(58) Field of Classification Search
  CPC ......... H01L 29/66068; H01L 29/66696; H01L 29/7816; H01L 29/7835
  USPC .......................................................... 257/77
  See application file for complete search history.

(56) References Cited

U.S. PATENT DOCUMENTS

| | | | | |
|---|---|---|---|---|
| 4,922,327 A * | 5/1990 | Mena | ................. | H01L 29/7816 257/336 |
| 5,068,700 A * | 11/1991 | Yamaguchi | ......... | H01L 29/0696 257/141 |
| 5,216,272 A * | 6/1993 | Kubokoya | ...... | H01L 21/823814 257/339 |
| 5,237,193 A * | 8/1993 | Williams | ............ | H01L 29/1087 257/336 |
| 5,304,827 A * | 4/1994 | Malhi | ................. | H01L 29/7835 257/262 |
| 5,386,136 A * | 1/1995 | Williams | ............ | H01L 29/1079 257/409 |
| 5,406,110 A * | 4/1995 | Kwon | ................ | H01L 29/0878 257/335 |
| 5,485,027 A * | 1/1996 | Williams | .............. | H01L 21/761 257/343 |
| 5,517,046 A * | 5/1996 | Hsing | ................. | H01L 23/4824 257/336 |
| 5,650,658 A * | 7/1997 | Beasom | .......... | H01L 21/823462 257/344 |
| 5,821,583 A * | 10/1998 | Hshieh | ................ | H01L 29/7813 257/330 |
| 5,844,272 A * | 12/1998 | Soderbarg | ............. | H01L 29/402 257/328 |
| 5,883,402 A * | 3/1999 | Omura | ................ | H01L 27/0248 257/146 |
| 6,097,063 A * | 8/2000 | Fujihira | .............. | H01L 29/0619 257/139 |
| 6,242,787 B1 * | 6/2001 | Nakayama | .......... | H01L 21/8249 257/493 |
| 6,255,154 B1 * | 7/2001 | Akaishi | ................ | H01L 21/266 257/E21.346 |
| 6,355,944 B1 * | 3/2002 | Alok | ................... | H01L 29/7834 257/288 |
| 6,452,231 B1 * | 9/2002 | Nakagawa | .......... | H01L 27/0623 257/335 |
| 6,507,071 B1 | 1/2003 | Tihanyi | | |
| 6,525,375 B1 | 2/2003 | Yamaguchi et al. | | |
| 6,566,709 B2 * | 5/2003 | Fujihira | .............. | H01L 29/0619 257/266 |
| 6,608,350 B2 * | 8/2003 | Kinzer | ................ | H01L 29/0634 257/341 |
| 6,717,230 B2 * | 4/2004 | Kocon | .................. | H01L 29/404 257/328 |
| 6,774,434 B2 * | 8/2004 | Hueting | ............. | H01L 29/0653 257/340 |
| 6,784,059 B1 * | 8/2004 | Taniguchi | ....... | H01L 21/823814 257/328 |
| 6,787,872 B2 * | 9/2004 | Kinzer | ................ | H01L 29/0634 257/492 |
| 6,835,993 B2 * | 12/2004 | Sridevan | ............. | H01L 29/0634 257/330 |
| 6,903,416 B2 * | 6/2005 | Henninger | .......... | H01L 29/7813 257/329 |
| 6,921,943 B2 * | 7/2005 | Kenney | ................... | H01L 29/02 257/152 |
| 6,949,798 B2 * | 9/2005 | Nitta | ............... | H01L 29/0634 257/339 |
| 6,972,458 B2 * | 12/2005 | Suzuki | ................ | H01L 29/0696 257/328 |
| 7,473,976 B2 * | 1/2009 | Kocon | .................. | H01L 29/407 257/252 |
| 7,489,007 B2 * | 2/2009 | Williams | ............. | H01L 21/761 257/335 |
| 7,535,057 B2 * | 5/2009 | Yang | ..................... | H01L 29/407 257/335 |
| 7,553,722 B2 * | 6/2009 | Sakakibara | ......... | H01L 27/0255 257/213 |
| 7,569,900 B2 * | 8/2009 | Imai | ...................... | H01L 29/086 257/340 |
| 7,646,061 B2 * | 1/2010 | Hirler | ................ | H01L 29/0634 257/341 |
| 7,804,150 B2 * | 9/2010 | Jeon | .................... | H01L 29/0634 257/110 |
| 7,829,940 B2 * | 11/2010 | Hirler | ................... | H01L 29/407 257/329 |
| 7,893,458 B2 * | 2/2011 | Takahashi | ........... | H01L 27/0727 257/141 |
| 8,048,765 B2 * | 11/2011 | Chen | ................... | H01L 29/0856 257/327 |
| 8,163,621 B2 * | 4/2012 | Chu | .................... | H01L 29/0653 438/296 |
| 8,461,648 B2 * | 6/2013 | Pfirsch | ............... | H01L 29/0634 257/328 |
| 8,569,842 B2 * | 10/2013 | Weis | .................. | H01L 27/0207 257/194 |
| 8,685,824 B2 * | 4/2014 | Huang | ................ | H01L 29/7817 257/343 |
| 8,716,794 B2 * | 5/2014 | Luo | ..................... | H01L 27/1203 257/343 |
| 8,946,814 B2 * | 2/2015 | Anderson | ........... | H01L 29/7813 257/330 |
| 8,994,105 B2 * | 3/2015 | Korec | ................ | H01L 29/7393 257/341 |
| 9,029,871 B2 * | 5/2015 | Soeno | ................ | H01L 29/66734 257/330 |
| 9,087,707 B2 * | 7/2015 | Mauder | ............... | H01L 29/7801 |
| 9,099,522 B2 * | 8/2015 | Onozawa | ............ | H01L 29/0661 |
| 9,450,074 B1 * | 9/2016 | Yang | ...................... | H01L 29/402 |
| 9,484,454 B2 * | 11/2016 | Levy | ................... | H01L 29/0634 |
| 9,515,197 B2 * | 12/2016 | Takeuchi | ............ | H01L 21/8213 |
| 10,103,240 B2 * | 10/2018 | Bobde | ............... | H01L 29/66909 |
| 2001/0045599 A1 | 11/2001 | Hueting et al. | | |
| 2003/0141514 A1 | 7/2003 | Yamaguchi et al. | | |
| 2003/0209741 A1 * | 11/2003 | Saitoh | ................ | H01L 29/1095 257/288 |

(56) References Cited

U.S. PATENT DOCUMENTS

| | | | |
|---|---|---|---|
| 2005/0001265 A1* | 1/2005 | Shiraki | H01L 21/763 257/330 |
| 2006/0076621 A1 | 4/2006 | Hirler | |
| 2011/0210391 A1 | 9/2011 | Kitagawa | |
| 2013/0249602 A1* | 9/2013 | Mauder | H01L 29/7801 327/108 |
| 2016/0197176 A1* | 7/2016 | Stefanov | H01L 29/404 257/334 |

* cited by examiner

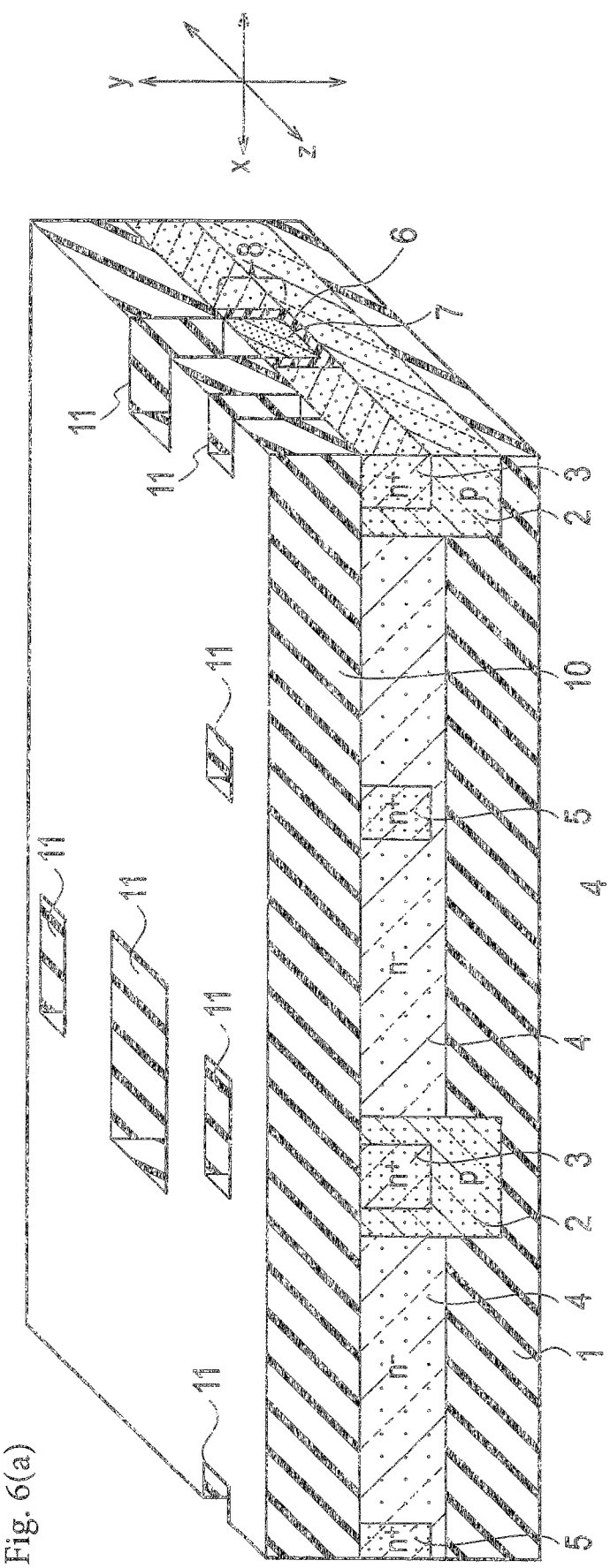
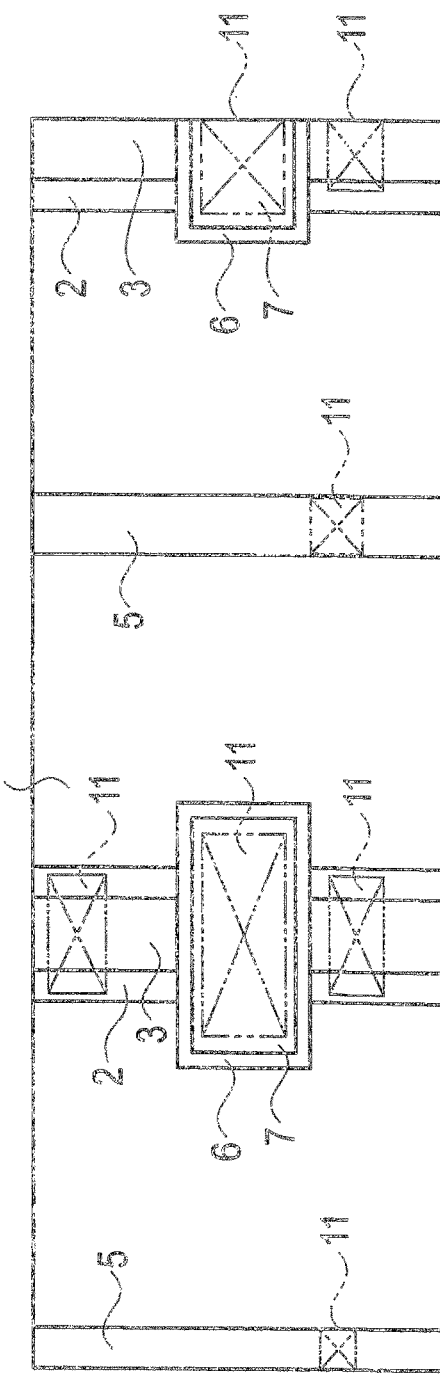
Fig. 6(a)
Fig. 6(b)

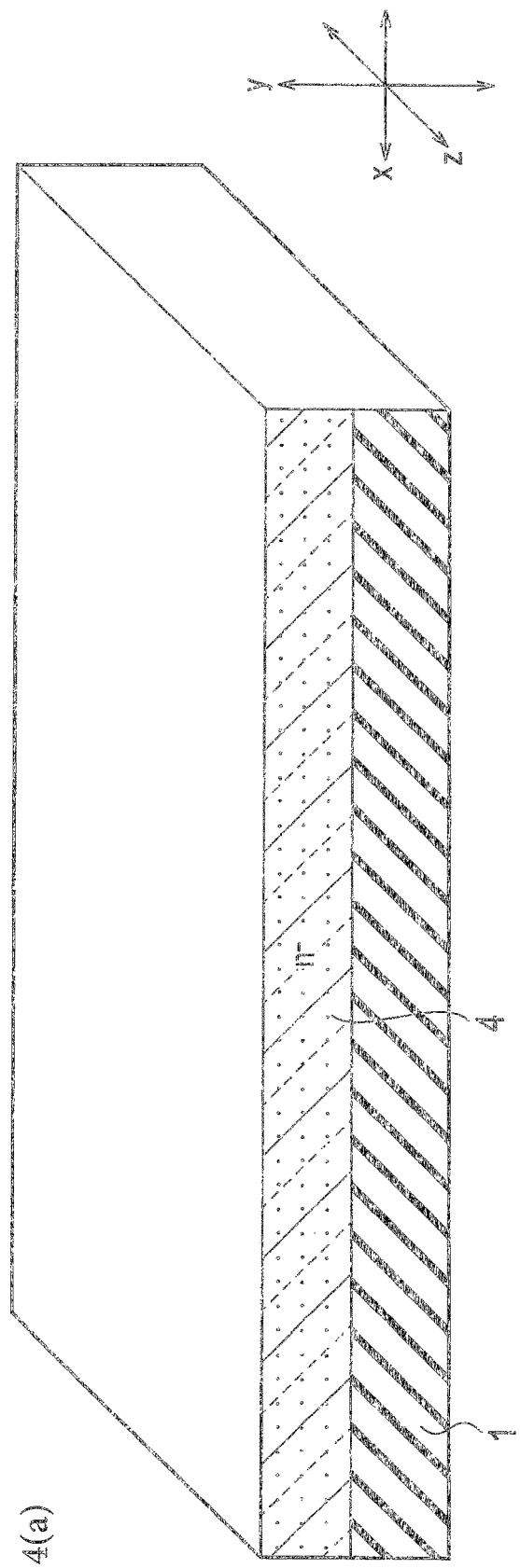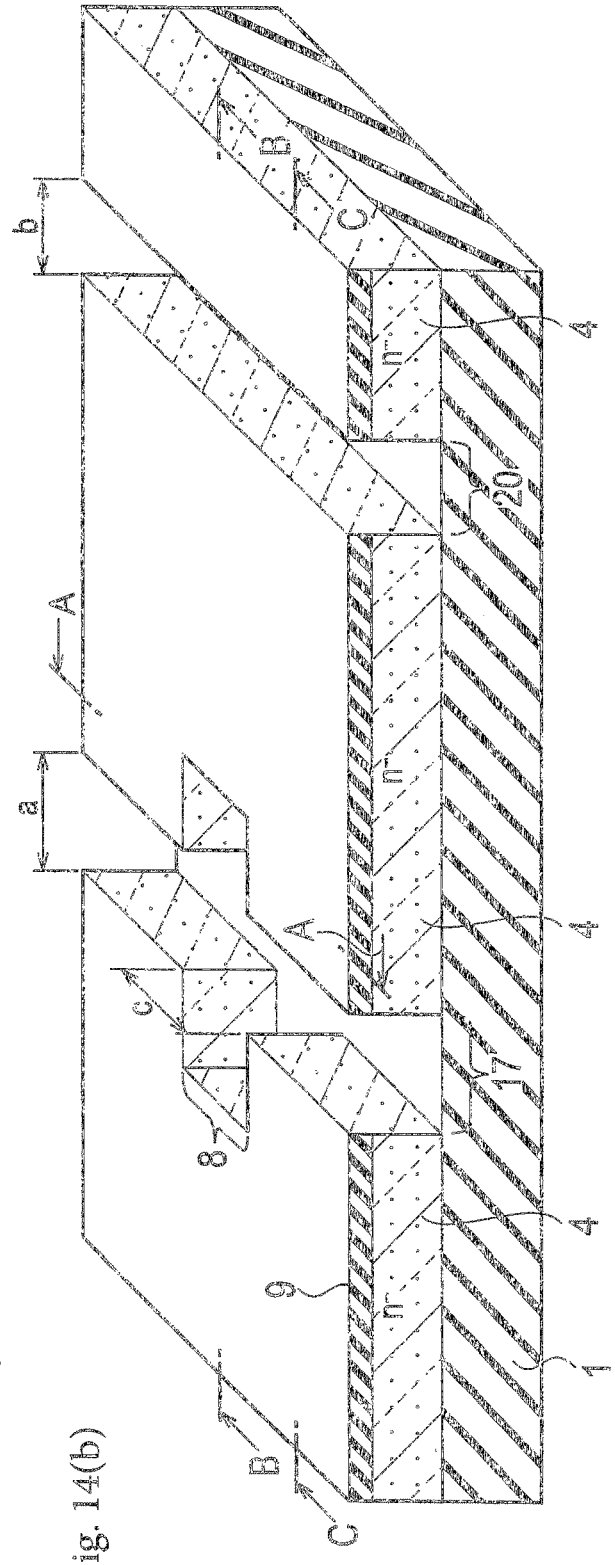
Fig. 14(a)
Fig. 14(b)

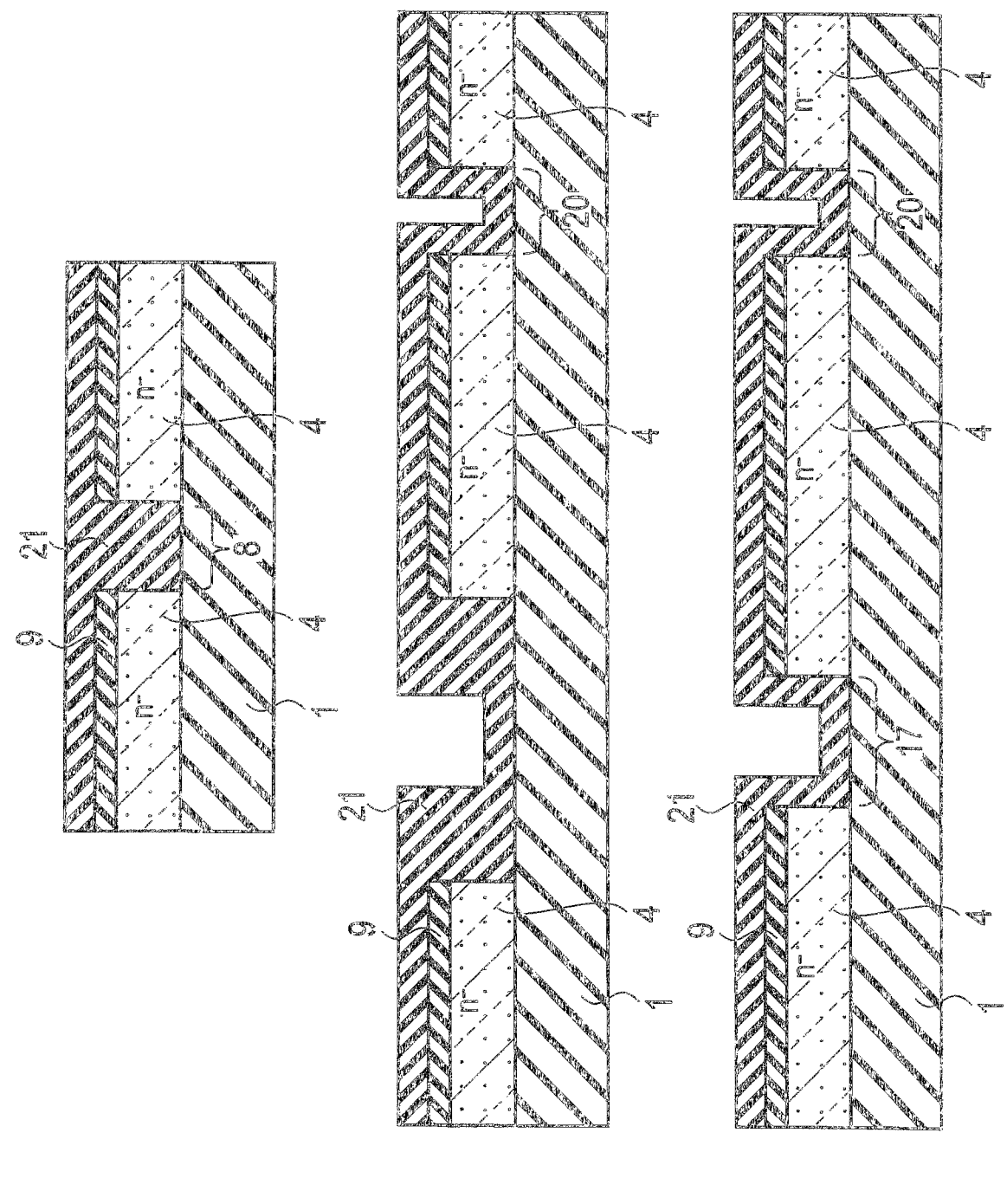

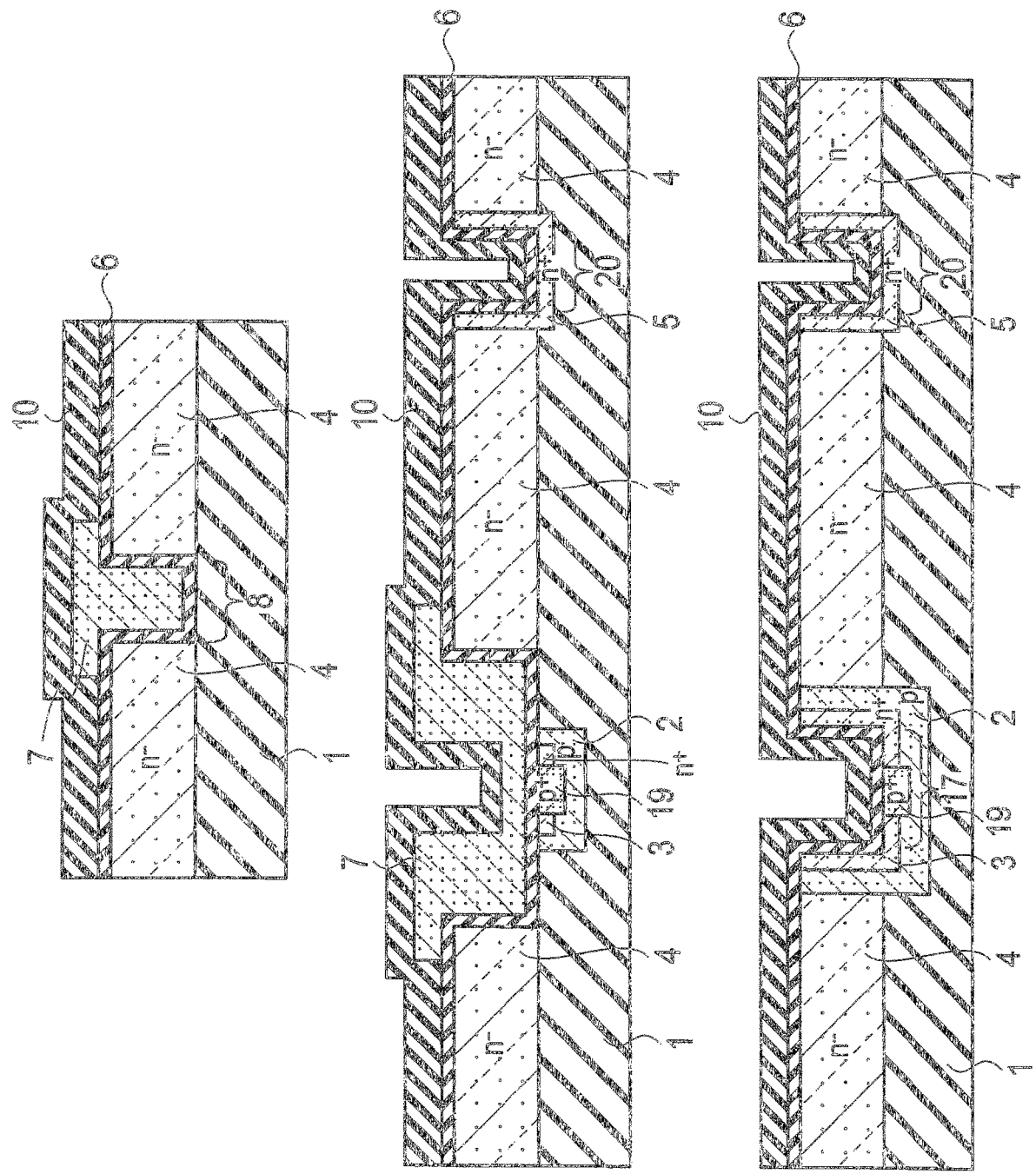

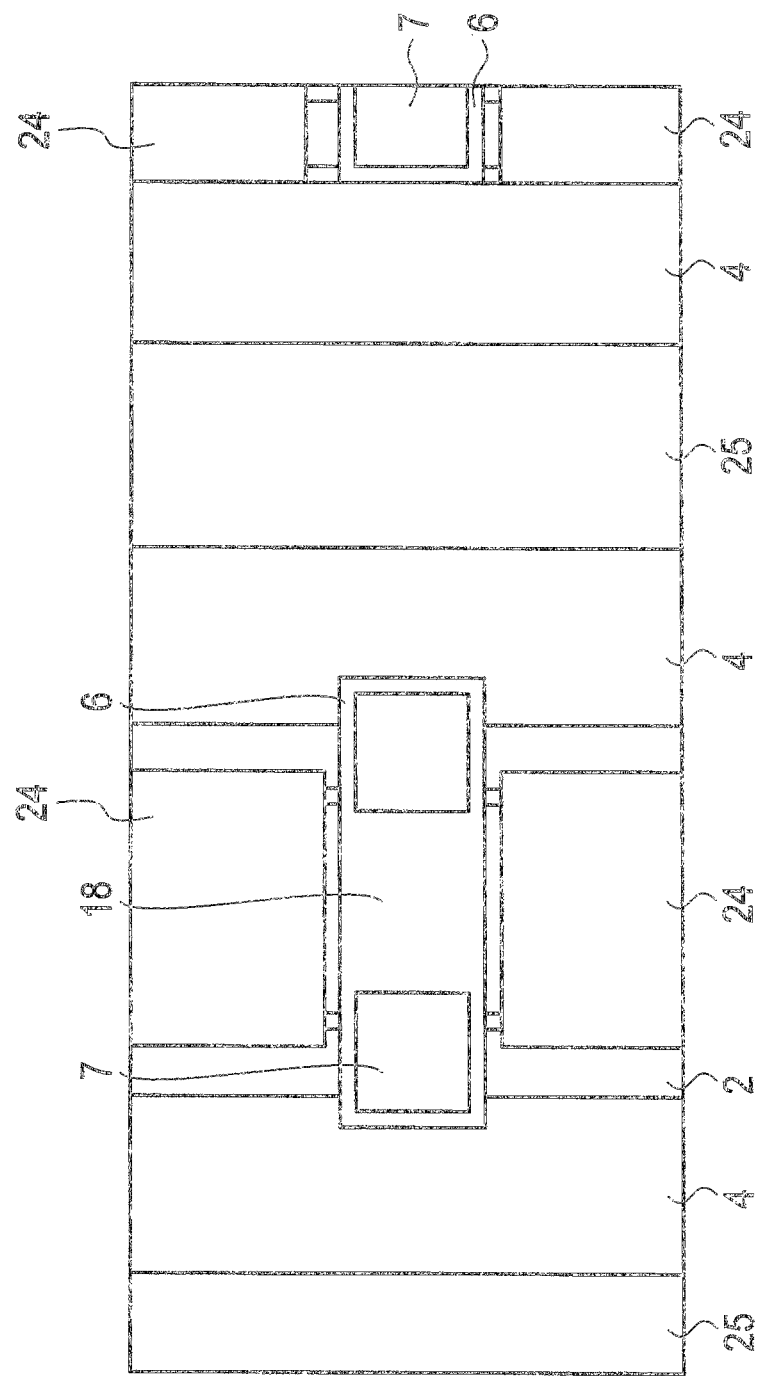

SEMICONDUCTOR DEVICE AND METHOD OF MANUFACTURING THE SAME

CROSS-REFERENCE TO RELATED APPLICATION(S)

The entire content of Japanese Patent Application No. 2013-150408 (filed on Jul. 19, 2013) is incorporated herein by reference

TECHNICAL FIELD

This disclosure relates to a semiconductor device and a method of manufacturing the same.

BACKGROUND

There is known a semiconductor device having a structure in which a well region where a channel is formed, a source region and a drain region are formed in a drift region and extend from a surface of the drift region in a direction perpendicular to the surface (for example, refer to Japanese Patent Unexamined Publication No. 2001-274398). In the semiconductor device described in Japanese Patent Unexamined Publication No. 2001-274398, a gate electrode formed into a trench also extends in the drift region from the surface of the drift region in the direction perpendicular to the surface.

This type of semiconductor device has a lateral structure parallel to a surface of a semiconductor substrate. A principal current directly controlled by the gate electrode flows in a direction parallel to the surface of the semiconductor substrate and is distributed from the surface of the semiconductor substrate in a direction perpendicular to the surface. Therefore, the flow of the principal current is not restricted by a surface area of the semiconductor substrate. Further, since a channel width can be defined by a depth of the drift region, the channel width can be increased even when the semiconductor substrate has a fixed surface area.

In the semiconductor device described in Japanese Patent Unexamined Publication No. 2001-274398, the well region extends in the depth direction of the drift region, and the edge of the well region is located within the drift region. A conventional vertical-type semiconductor device is provided with a guard ring in order to prevent electric field concentration at an edge of a well region.

The semiconductor device described in Japanese Patent Unexamined Publication No. 2001-274398, which is a lateral-type semiconductor device and therefore difficult to be provided with a guard ring, cannot reduce electric field concentration at the edge of the well region. Thus, the semiconductor device described in Japanese Patent Unexamined Publication No. 2001-274398 has a problem of a reduction in voltage resistance in the entire device.

SUMMARY

In view of the above-described conventional problem, an object of the present invention is to provide a semiconductor device having improved voltage resistance.

A semiconductor device according to an aspect of the present invention includes: a substrate; a first conductivity type drift region formed on a first main surface of the substrate, formed of a same material as the substrate and having a higher impurity concentration than the substrate; a second conductivity type well region formed in the drift region to extend from a second main surface of the drift region opposite to a first main surface of the drift region in contact with the substrate in a direction perpendicular to the second main surface and including an edge extending to an inside of the substrate; a first conductivity type drain region formed in the drift region to be separated from the well region and extend from the second main surface in the perpendicular direction; a first conductivity type source region formed in the well region to extend from the second main surface in the perpendicular direction; a gate groove extending from the second main surface in the perpendicular direction and penetrating the source region and the well region in a direction parallel to the second main surface; a gate electrode formed on a surface of the gate groove with a gate insulating film interposed therebetween; a source electrode electrically connected to the source region and the well region; and a drain electrode electrically connected to the drain region.

BRIEF DESCRIPTION OF THE DRAWINGS

FIG. 6(a) is a perspective view continued from FIG. 5 for explaining the method of manufacturing the semiconductor device according to the first embodiment of the present invention, and FIG. 6(b) is a top view of FIG. 6(a);

FIG. 14(a) is a perspective view for explaining a method of manufacturing the semiconductor device according to the second embodiment of the present invention, and FIG. 14(b)

Figures 15A, 15B, 15C:
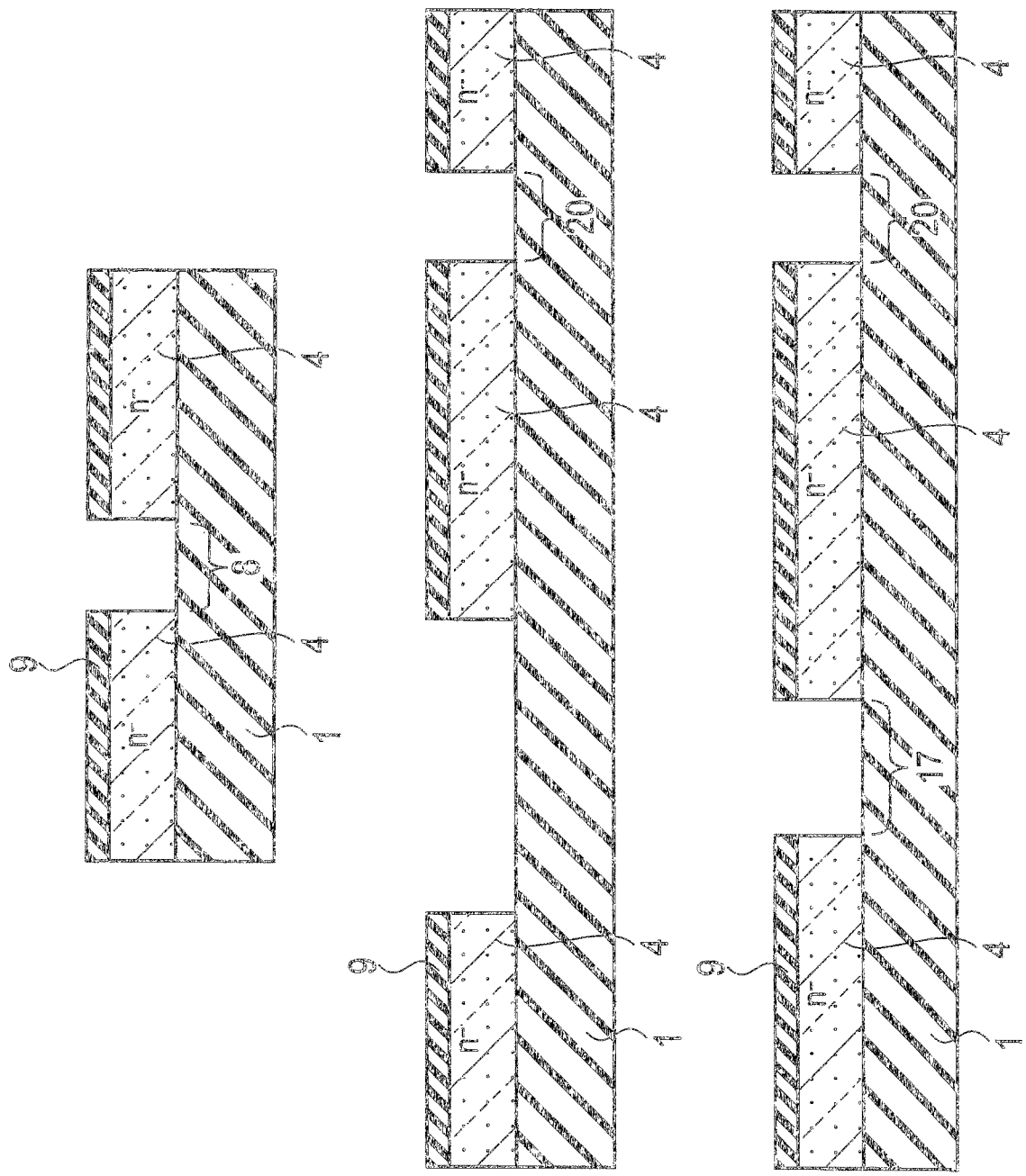
Figure 17A:
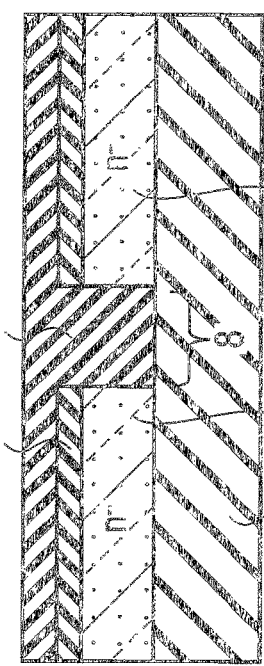
Figure 17B:
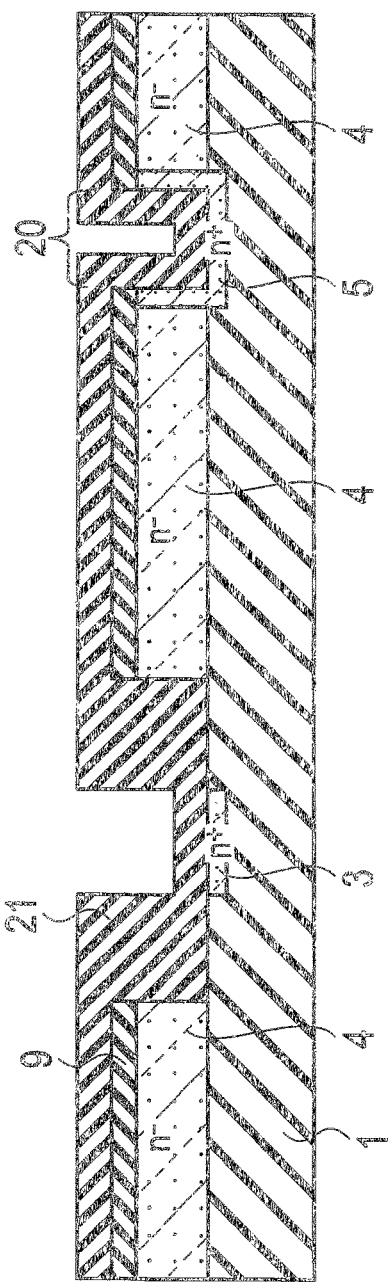
Figure 17C:
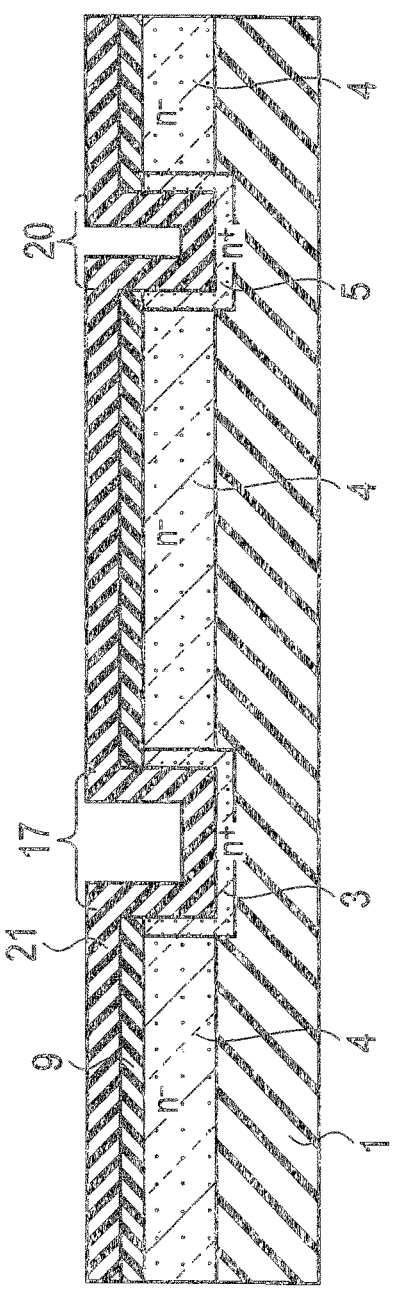
Figure 18A:
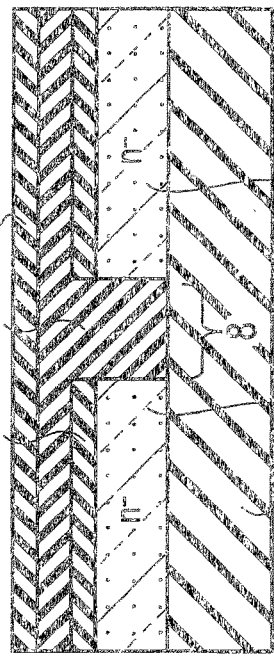
Figure 18B:
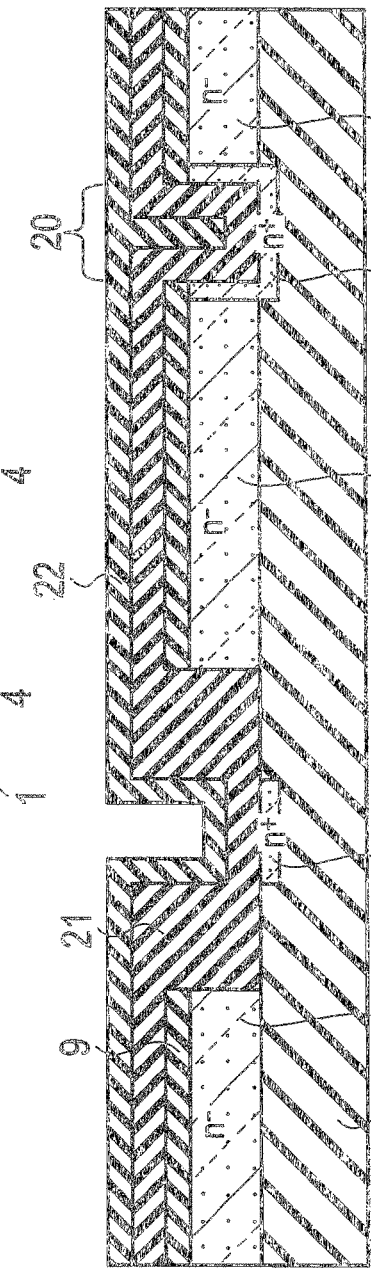
Figure 18C:
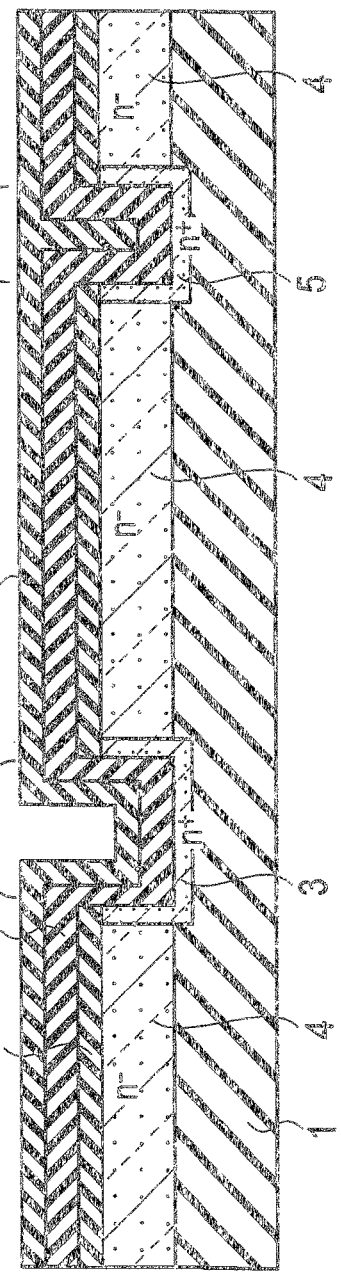
Figures 19A, 19B, 19C:
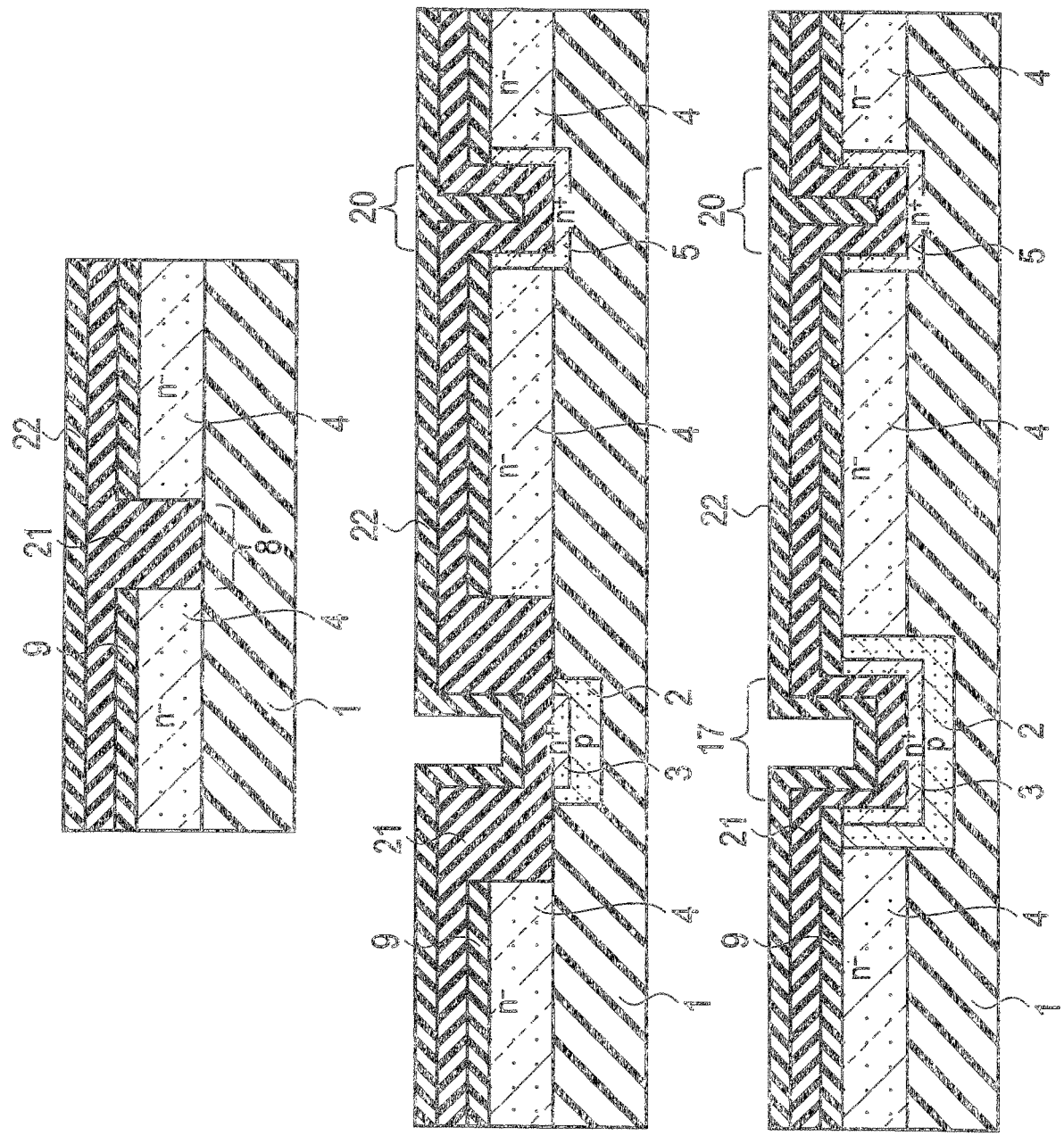
Figure 20A:
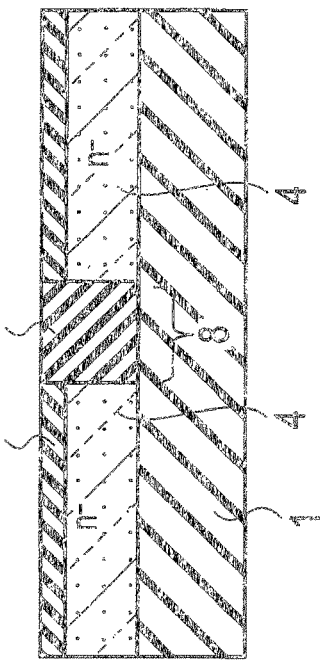
Figure 20B:
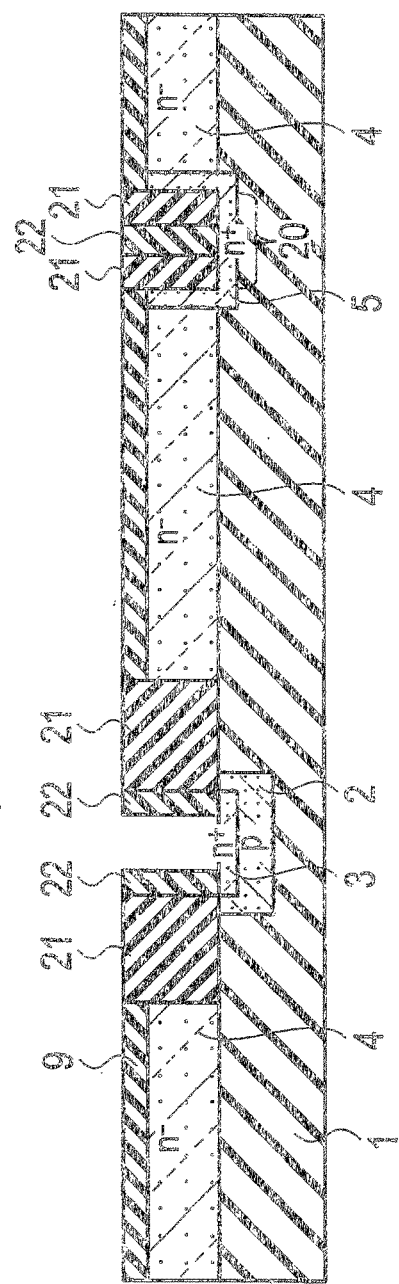
Figure 20C:
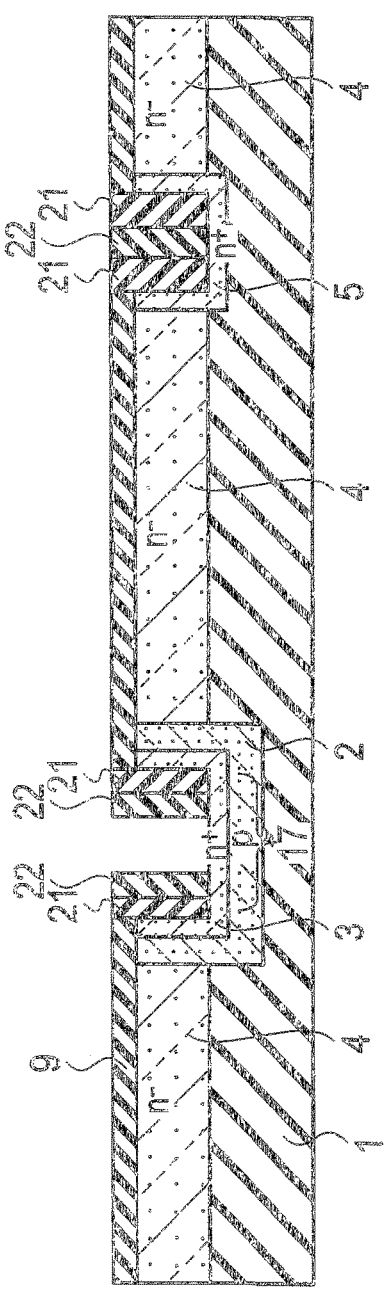
Figure 21A:
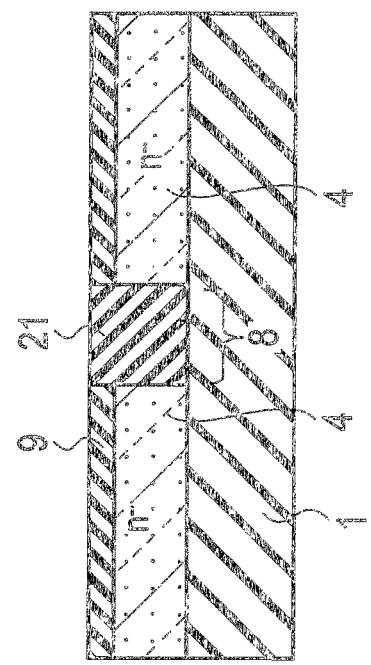
Figure 21B:
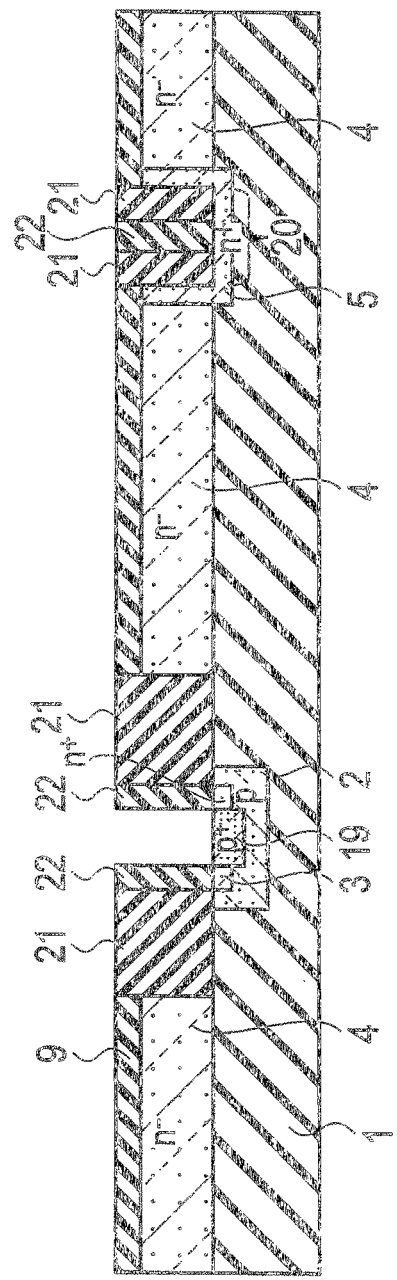
Figure 21C:
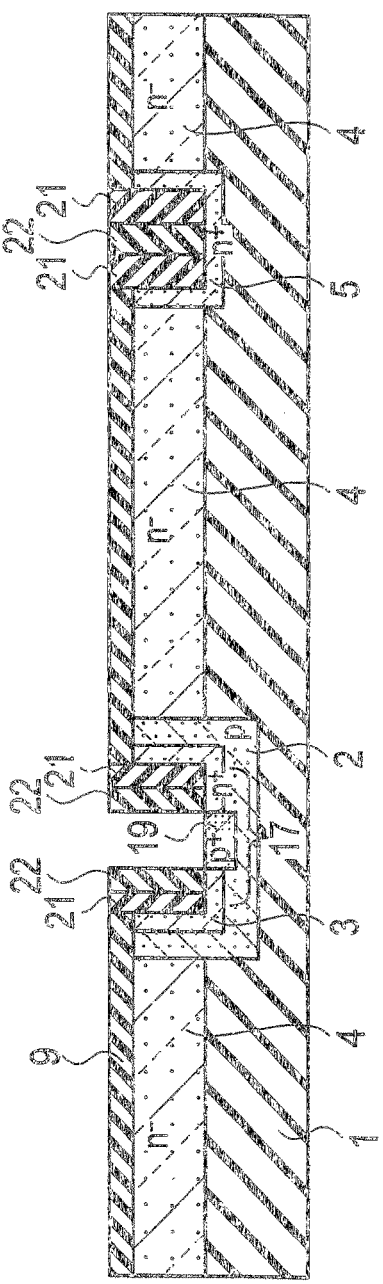
Figure 22A:
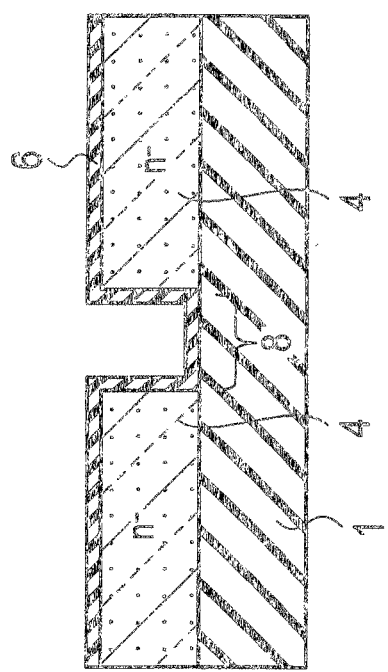
Figure 22B:
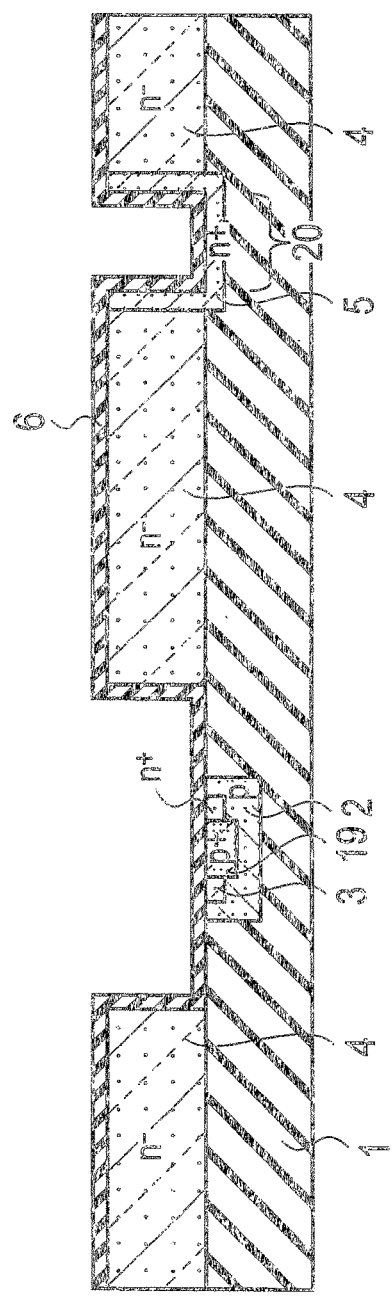
Figure 22C:
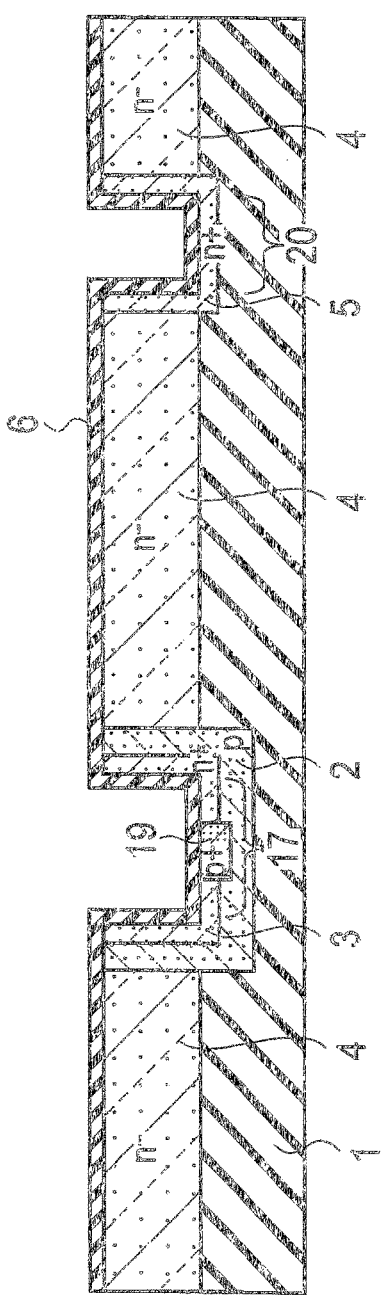
Figure 23A:
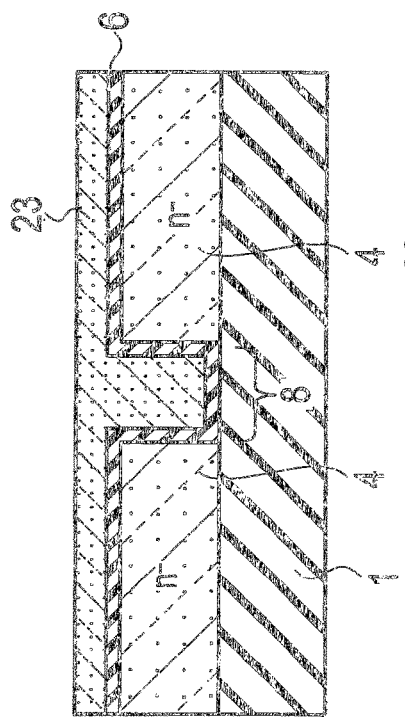
Figure 23B:
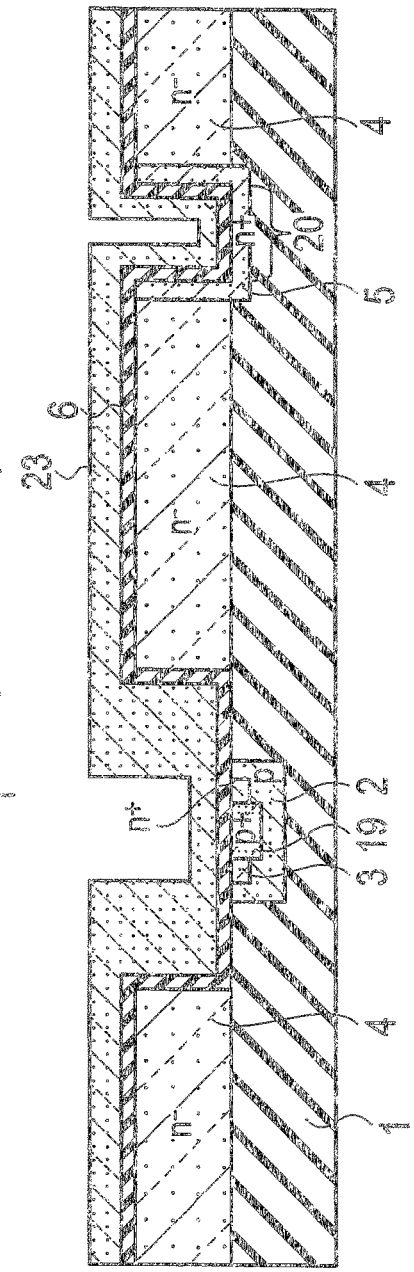
Figure 23C:
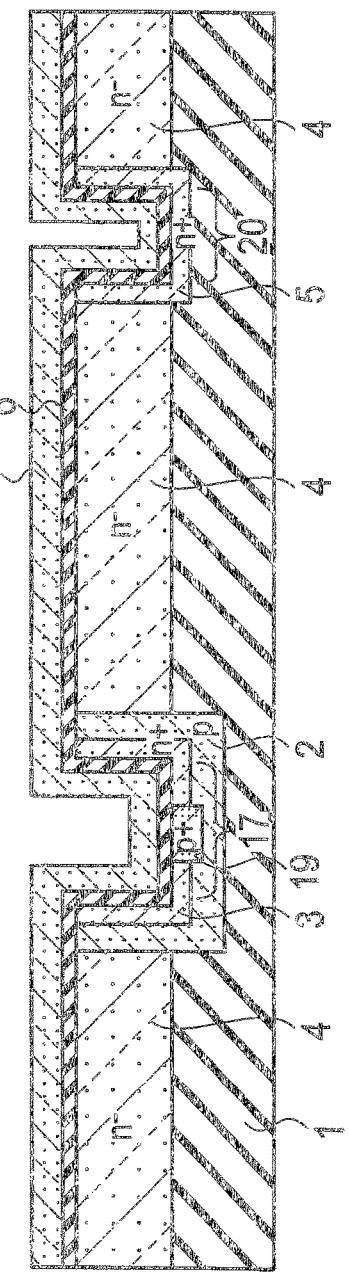
Figure 24A:
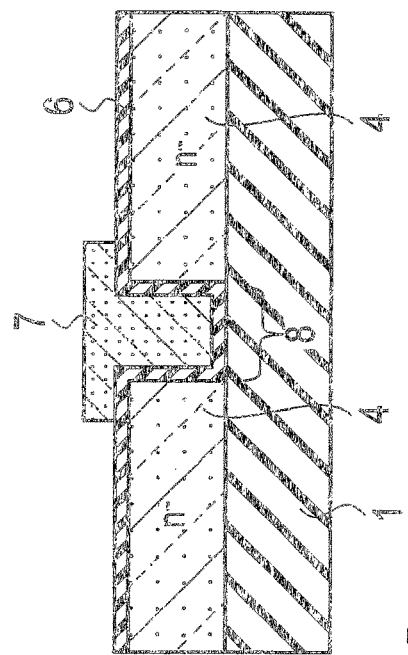
Figure 24B:
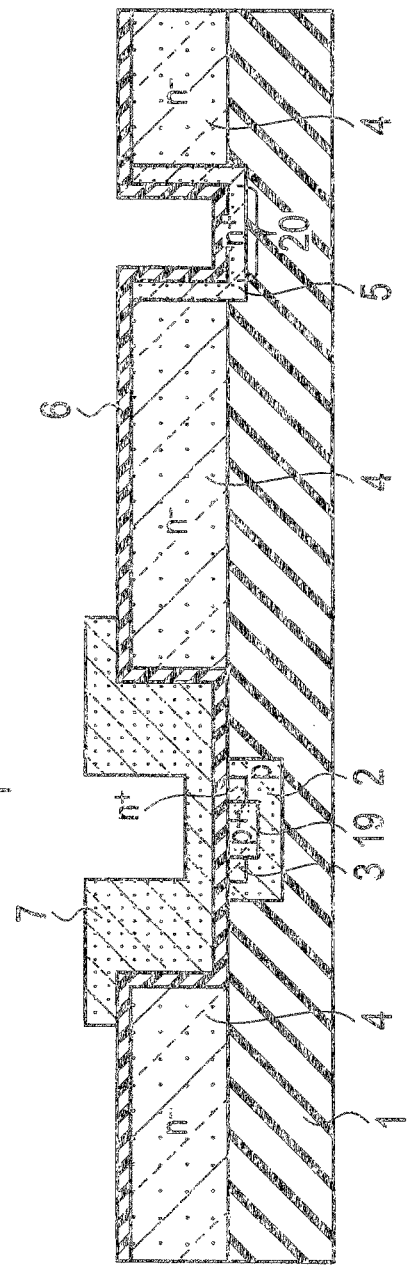
Figure 24C:
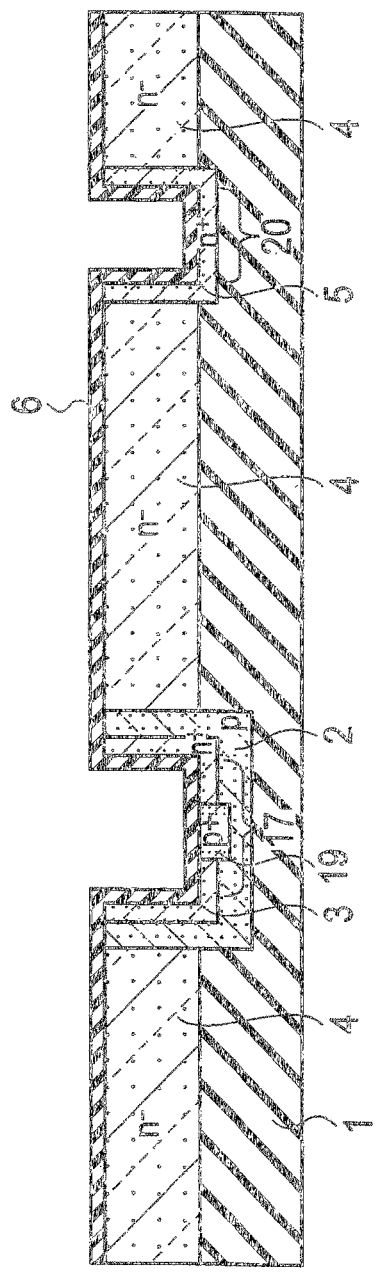
Figure 26:
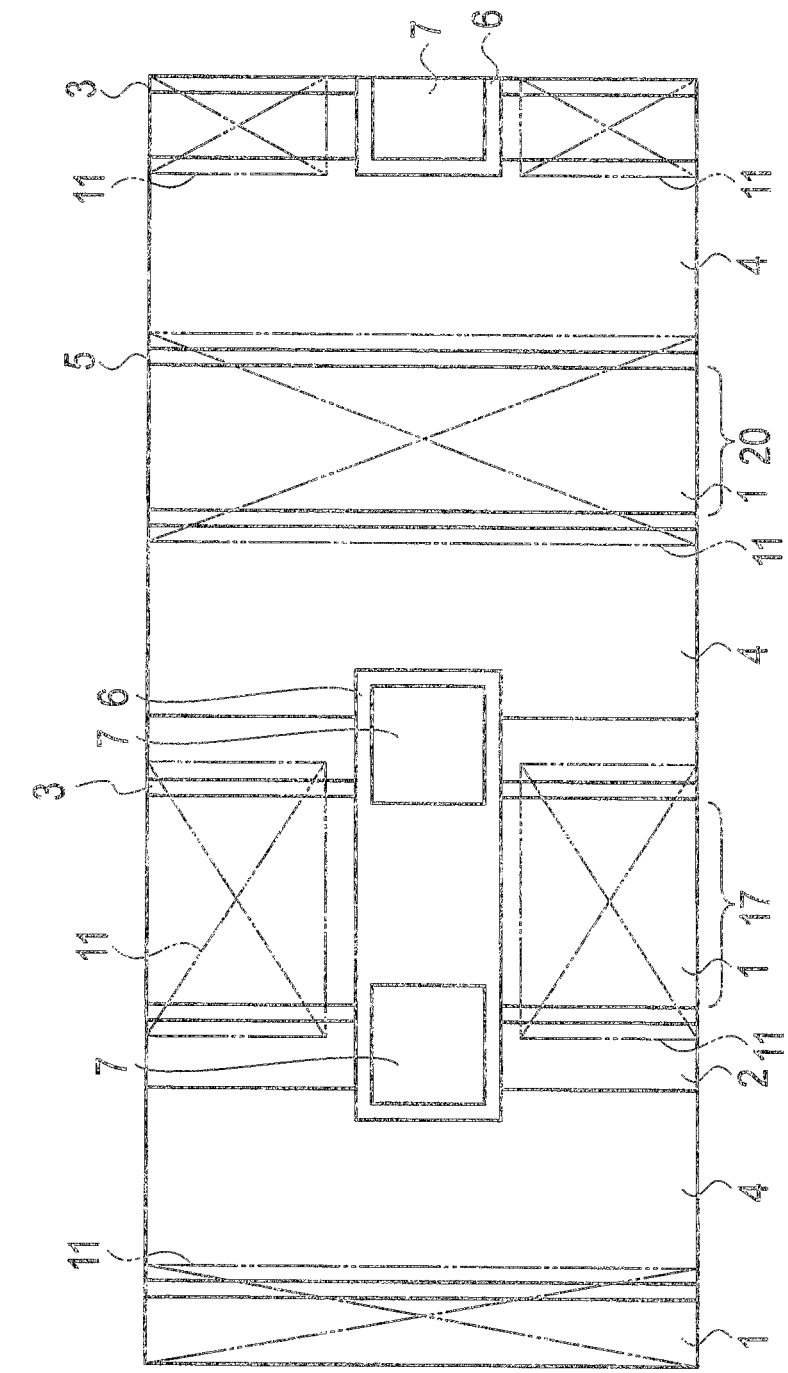
Figure 27A:
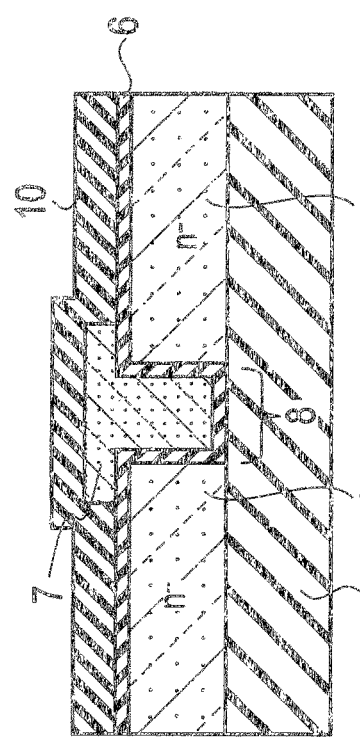
Figure 27B:
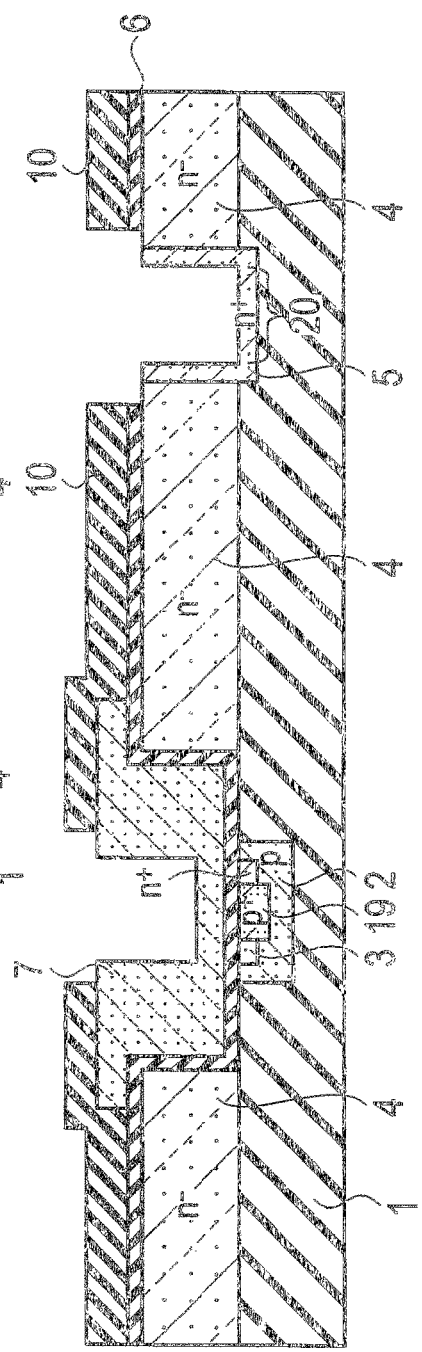
Figure 27C:
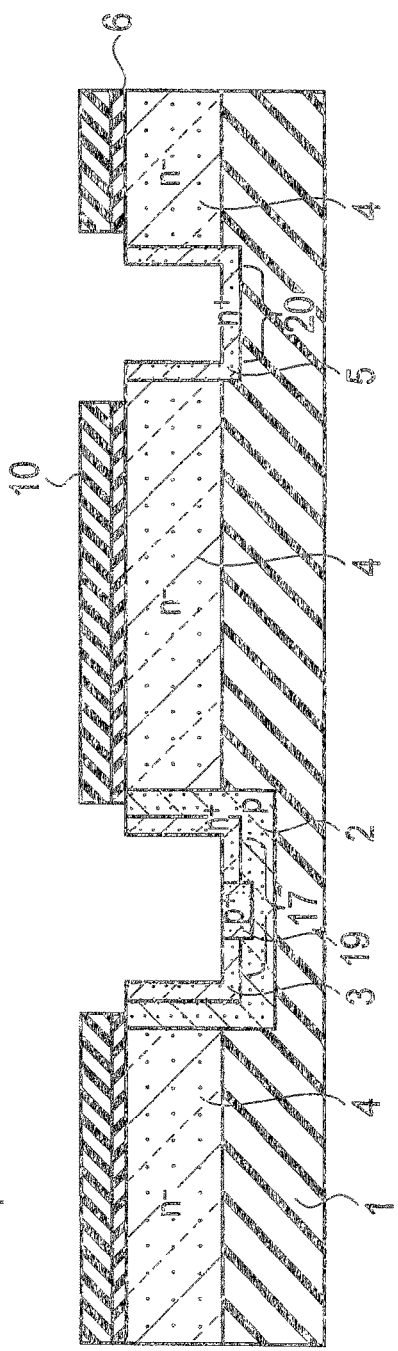
Figure 28A:
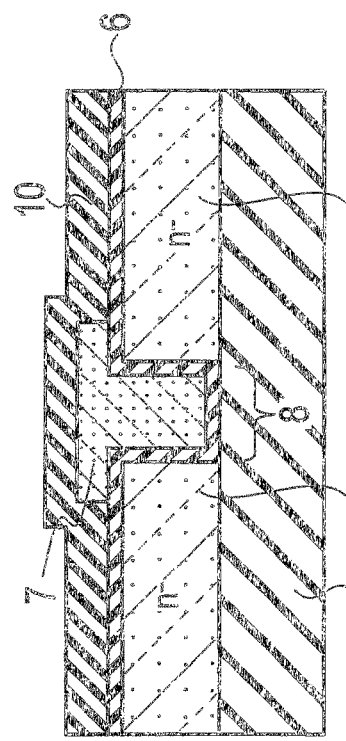
Figure 28B:
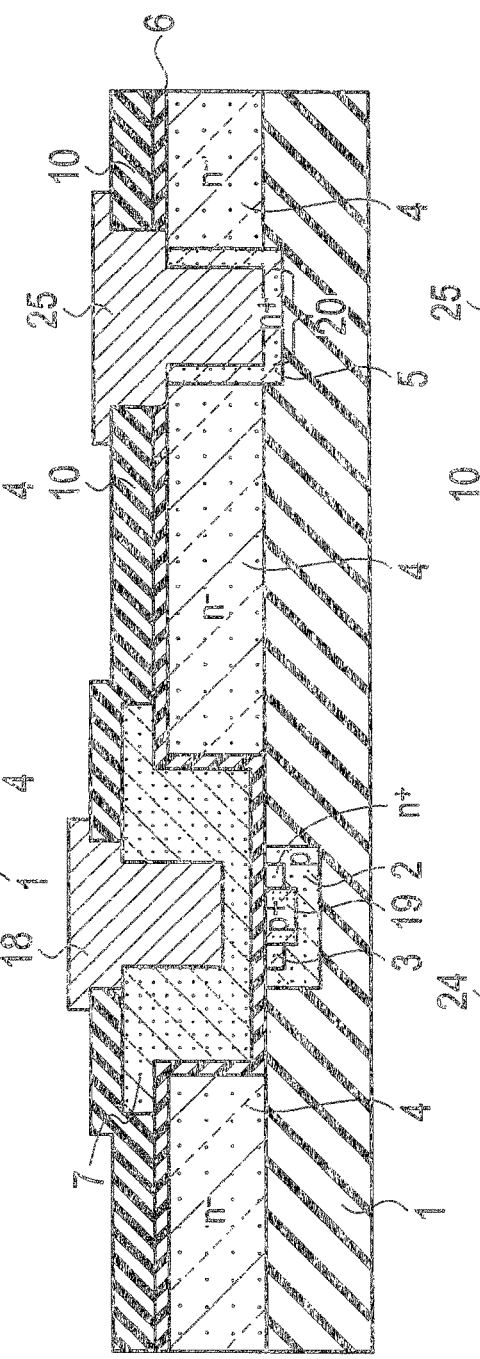
Figure 28C:
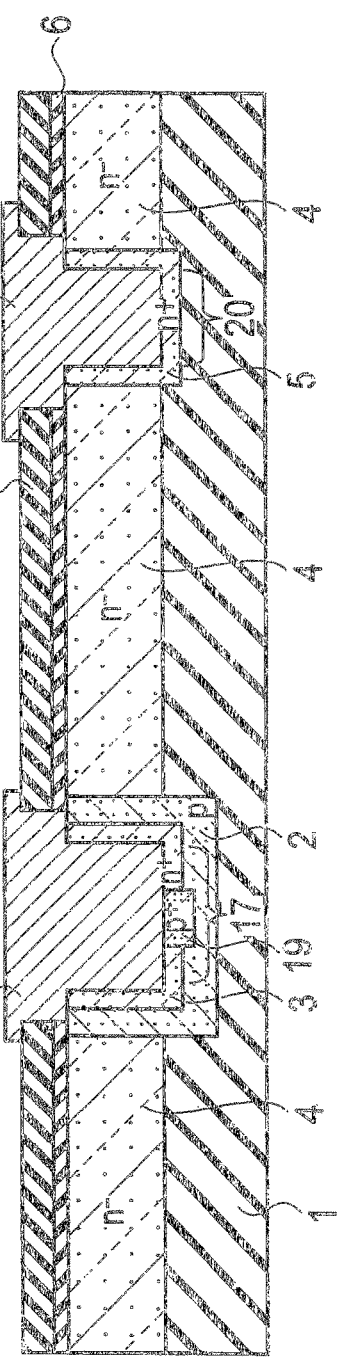

is a perspective view continued from FIG. 14(a) for explaining the method of manufacturing the semiconductor device according to the second embodiment of the present invention;

FIG. 15(a) is a cross-sectional view taken along line A-A in FIG. 14(b), FIG. 15(b) is a cross-sectional view taken along line B-B in FIG. 14(b), and FIG. 15(c) is a cross-sectional view taken along line C-C in FIG. 14(b);

FIG. 16(a) to FIG. 16(c) are cross-sectional views continued from FIG. 15(a) to FIG. 15(c) for explaining the method of manufacturing the semiconductor device according to the second embodiment of the present invention;

FIG. 17(a) to FIG. 17(c) are cross-sectional views continued from FIG. 16(a) to FIG. 16(c) for explaining the method of manufacturing the semiconductor device according to the second embodiment of the present invention;

FIG. 18(a) to FIG. 18(c) are cross-sectional views continued from FIG. 17(a) to FIG. 17(c) for explaining the method of manufacturing the semiconductor device according to the second embodiment of the present invention;

FIG. 19(a) to FIG. 19(c) are cross-sectional views continued from FIG. 18(a) to FIG. 18(c) for explaining the method of manufacturing the semiconductor device according to the second embodiment of the present invention;

FIG. 20(a) to FIG. 20(c) are cross-sectional views continued from FIG. 19(a) to FIG. 19(c) for explaining the method of manufacturing the semiconductor device according to the second embodiment of the present invention;

FIG. 21(a) to FIG. 21(c) are cross-sectional views continued from FIG. 20(a) to FIG. 20(c) for explaining the method of manufacturing the semiconductor device according to the second embodiment of the present invention;

FIG. 22(a) to FIG. 22(c) are cross-sectional views continued from FIG. 21(a) to FIG. 21(c) for explaining the method of manufacturing the semiconductor device according to the second embodiment of the present invention;

FIG. 23(a) to FIG. 23(c) are cross-sectional views continued from FIG. 22(a) to FIG. 22(c) for explaining the method of manufacturing the semiconductor device according to the second embodiment of the present invention;

FIG. 24(a) to FIG. 24(c) are cross-sectional views continued from FIG. 23(a) to FIG. 23(c) for explaining the method of manufacturing the semiconductor device according to the second embodiment of the present invention;

FIG. 25(a) to FIG. 25(c) are cross-sectional views continued from FIG. 24(a) to FIG. 24(c) for explaining the method of manufacturing the semiconductor device according to the second embodiment of the present invention;

FIG. 26 is a top view entirely showing FIG. 25(a) to FIG. 25(c);

FIG. 27(a) to FIG. 27(c) are cross-sectional views continued from FIG. 25(a) to FIG. 25(c) for explaining the method of manufacturing the semiconductor device according to the second embodiment of the present invention;

FIG. 28(a) to FIG. 28(c) are cross-sectional views continued from FIG. 27(a) to FIG. 27(c) for explaining the method of manufacturing the semiconductor device according to the second embodiment of the present invention;

FIG. 29 is a top view entirely showing FIG. 28(a) to FIG. 28(c); and

Figure 30:
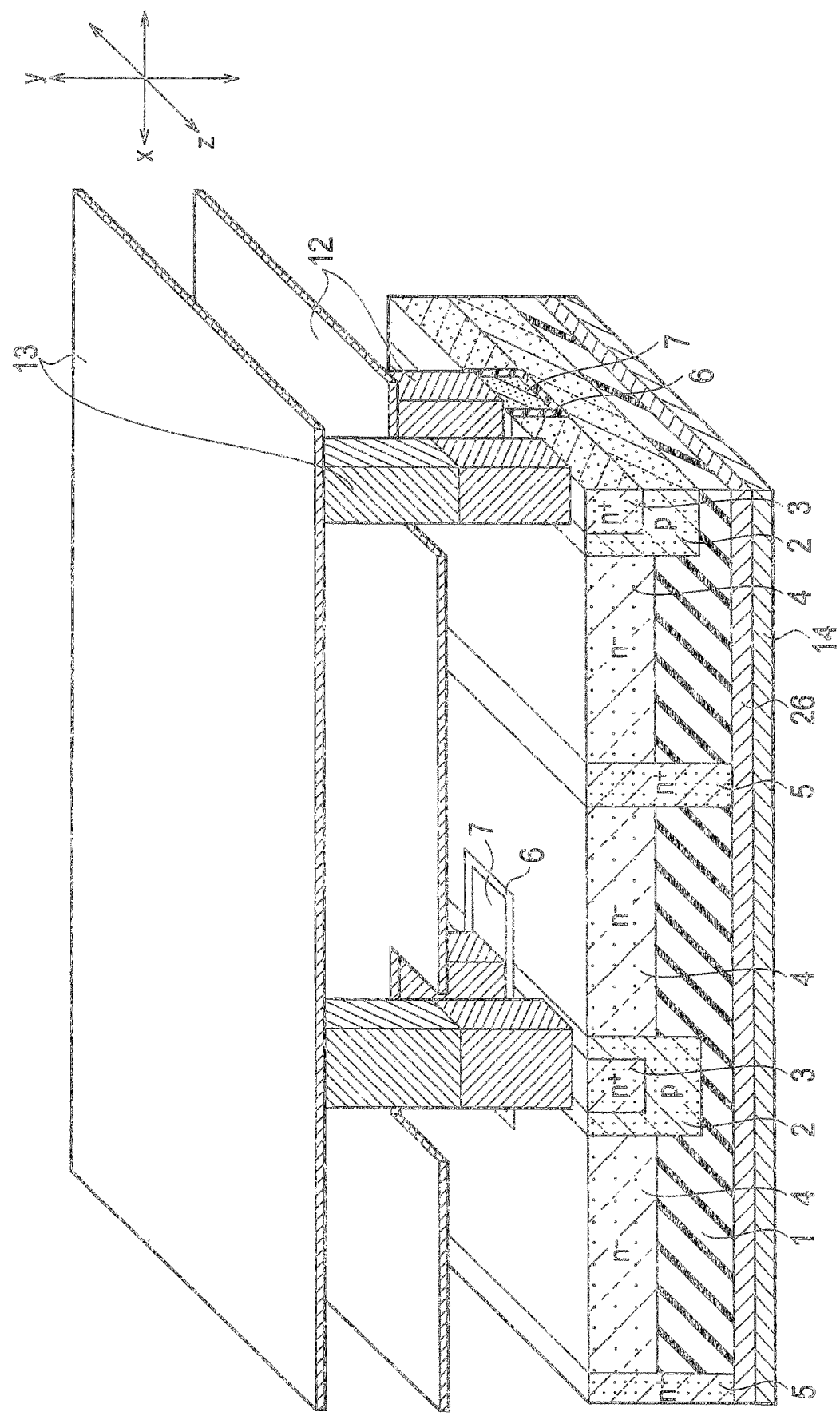

FIG. 30 is a perspective view showing an example of a semiconductor device according to a third embodiment of the present invention.

DESCRIPTION OF THE EMBODIMENTS

Hereinafter, embodiments of the present invention will be explained with reference to the drawings. The same or similar elements in the following explanations of the drawings are indicated by the same or similar reference numerals. In the embodiments of the present invention, "a first conductivity type" and "a second conductivity type" are opposite conductivity types. Namely, when the first conductivity type is an n-type, the second conductivity type is a p-type, and when the first conductivity type is a p-type, the second conductivity type is an n-type. The present invention will be illustrated with an example in which the first conductivity type is an n-type and the second conductivity type is a p-type; however, the first conductivity type may be a p-type and the second conductivity type may be an n-type instead. When the n-type and the p-type are switched, a polarity of applied voltage is also reversed.

First Embodiment

Figure 1:
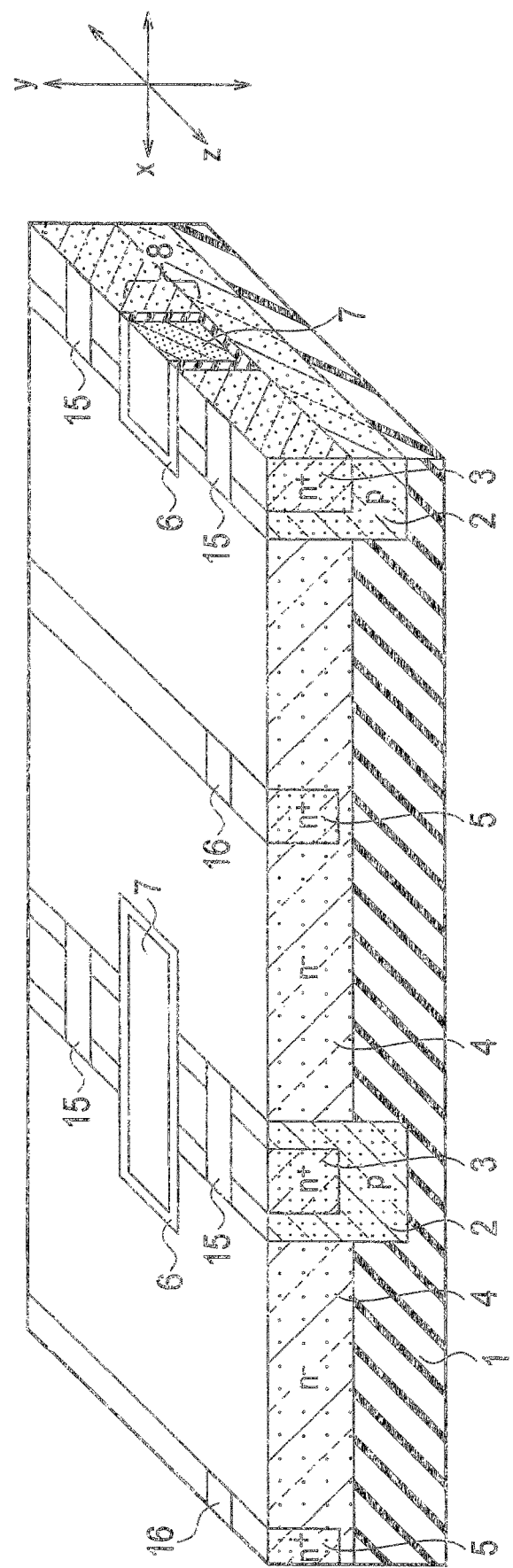
FIG. 1 is a perspective view showing an example of a semiconductor device according to a first embodiment of the present invention.

FIG. 1 is a perspective view schematically showing a configuration of a semiconductor device according to a first embodiment of the present invention. The first embodiment exemplifies a metal-oxide-semiconductor field-effect transistor (MOSFET) used as the semiconductor device. FIG. 1 does not show electrode wiring for convenience of explanation. FIG. 1 shows three semiconductor elements; however, the first embodiment is not limited thereto. For example, a number of semiconductor elements may be arranged in the x-axis and z-axis directions shown in FIG. 1.

As shown in FIG. 1, the semiconductor device according to the first embodiment of the present invention includes a substrate 1, an $n^-$-type drift region 4 formed on one main surface of the substrate 1, a p-type well region 2 provided in the drift region 4, an $n^+$-type source region 3 provided in the well region 2, an $n^+$-type drain region 5 provided in the drift region 4 and separated from the well region 2, and a gate electrode 7 provided in the drift region 4 with a gate insulating film 6 interposed therebetween.

The substrate 1 has a thickness of several tens to several hundreds of micrometers. The substrate 1 used may be a semi-insulating substrate or an insulating substrate. Here, an insulating substrate is a substrate having a sheet resistance of several kΩ/sq or greater, and a semi-insulating substrate is a substrate having a sheet resistance of several tens of Ω/sq or greater. The material used for the substrate 1 may be silicon carbide (SiC). The first embodiment of the present invention exemplifies a case where the substrate 1 is an insulating substrate formed of silicon carbide.

The drift region 4 has a thickness of several to several tens of micrometers. An impurity concentration of the drift region 4 is higher than that of the substrate 1 and is approximately in a range of $1\times10^{14}$ to $1\times10^{18}$ cm$^{-3}$. The drift region 4 is formed of the same material as the substrate 1. When the substrate is formed of silicon carbide, the drift region 4 is an epitaxially grown layer formed of silicon carbide.

The well region 2 is provided in the drift region 4 to extend from one main surface of the drift region 4 (hereinafter, referred to as "second main surface") opposite to another main surface in contact with the substrate 1 (hereinafter, referred to as "first main surface") in a direction perpendicular to the second main surface of the drift region 4 (in the y-axis direction in FIG. 1). An edge of the well region 2 further extends to the inside of the substrate 1 in the direction perpendicular to the second main surface of the drift region 4 (in the y-axis direction in FIG. 1). Here, "the edge of the well region 2" represents a portion defined by a bottom surface of the well region 2 parallel to the second main surface of the drift region 4 and part of side surfaces of the well region 2 connected to the bottom surface and perpendicular to the second main surface of the drift region 4. The well region 2 also extends in the direction parallel to the second main surface of the drift region 4 (in the z-axis direction in FIG. 1). An impurity concentration of the well region 2 is approximately in a range of $1\times10^{15}$ to $1\times10^{19}$ cm$^{-3}$.

The source region 3 is provided in the well region 2 to extend from the second main surface of the drift region 4 in the direction perpendicular to the second main surface of the drift region 4 (in the y-axis direction in FIG. 1). The source region 3 extends parallel to the well region 2 in the direction parallel to the second main surface of the drift region 4 (in the z-axis direction in FIG. 1). The source region 3 is the same conductivity type as the drift region 4. An impurity concentration of the source region 3 is higher than the drift region 4 and is approximately in a range of $1\times10^{18}$ to $1\times10^{21}$ cm$^{-3}$. The source region 3 and the well region 2 are electrically connected with source electrodes 15 having the same potential. The material used for the source electrodes 15 may be nickel (Ni), titanium (Ti) or molybdenum (Mo).

A gate groove 8 is formed in the drift region 4. The gate groove 8 extends from the second main surface of the drift region 4 in the direction perpendicular to the second main surface of the drift region 4 (in the y-axis direction in FIG. 1). The gate groove 8 is formed to penetrate the source region 3 and the well region 2 in the direction parallel to the second main surface of the drift region 4 (in the x-axis direction in FIG. 1). The bottom surface of the gate groove 8 may be shallower than or conform to the bottom surface of the source region 3. The gate electrode 7 is formed on the surface of the gate groove 8 with the gate insulating film 6 interposed therebetween. The material used for the gate insulating film 6 may be a silicon oxide film (SiO$_2$ film). The material used for the gate electrode 7 may be n-type polysilicon.

The drain region 5 is provided to extend from the second main surface of the drift region 4 in the direction perpendicular to the second main surface of the drift region 4 (in the y-axis direction in FIG. 1). The drain region 5 extends parallel to the well region 2 and the source region 3 in the direction parallel to the second main surface of the drift region 4 (in the z-axis direction in FIG. 1). The drain region 5 is the same conductivity type as the drift region 4. An impurity concentration of the drain region 5 is higher than the drift region 4 and substantially the same as that of the source region 3 that is approximately in the range of $1\times10^{18}$ to $1\times10^{21}$ cm$^{-3}$. The drain region 5 is electrically connected with a drain electrode 16. The material used for the drain electrode 16 may be nickel (Ni), titanium (Ti) or molybdenum (Mo).

Next, a fundamental operation of the semiconductor device according to the first embodiment of the present invention is explained below.

The semiconductor device according to the first embodiment of the present invention functions as a transistor to control a potential of the gate electrode 7 in a state where the drain electrode 16 is applied with a positive potential based on a potential of the source electrodes 15. In other words, when a voltage between the gate electrode 7 and the source electrodes 15 reaches a predetermined threshold or greater, an inversion layer as a channel is formed in the well region 2 located toward the gate electrode 7 so as to be turned on, and a current thus flows from the drain electrode 16 to the source electrodes 15. More particularly, electrons flow from the source electrodes 15 to the source region 3 and further flow into the drift region 4 via the channel. The electrons in the drift region 4 further flow through the drain region 5 finally into the drain electrode 16.

When the voltage between the gate electrode 7 and the source electrodes 15 reaches the predetermined threshold or lower, the inversion layer in the well region 2 disappears to be turned off, and the current between the drain electrode 16 and the source electrodes 15 stops. At this time, a high voltage of several hundreds to several thousands of volts is applied between the drain and the source.

According to the first embodiment of the present invention, the semiconductor device has a lateral structure so that the channel width can be defined by the depth of the drift region 4 and therefore can be increased even when a surface area of the structure is fixed. In addition, the edge of the well region 2 extends to the inside of the substrate 1, so as to significantly reduce electric field concentration caused at the edge of the well region 2 and prevent a decrease in voltage resistance. Further, since the edge of the well region 2 extends to the inside of the substrate 1, and the impurity concentration of the substrate 1 is lower than that of the drift region 4, a breakdown voltage between the substrate 1 and the well region 2 is greater than that between the drift region 4 and the well region 2 when the drift region 4 and the substrate 1 have the same length in the direction parallel to the second main surface of the drift region 4. Accordingly, the voltage resistance can be further improved as compared with the structure described in Japanese Patent Unexamined Publication No. 2001-274398.

Further, since the substrate 1 is a semi-insulating substrate or an insulating substrate, the edge of the well region 2 is formed in an insulating region. Thus, the voltage resistance of the edge of the well region 2 can greatly be increased so that the semiconductor device having high voltage resistance can be ensured.

Further, since the material used for the substrate 1 is silicon carbide exerting high insulating performance and having high heat conductivity, the substrate 1 with the rear surface adhered to a cooling system via a binder can efficiently radiate heat caused by a current generated when the semiconductor device is turned on, so as to cool the semiconductor device efficiently. In addition, since silicon carbide is a semiconductor having a wide bandgap and has a low intrinsic carrier concentration, the semiconductor device effectively exerting high insulating performance and having high voltage resistance can be ensured.

An example of a method of manufacturing the semiconductor device according to the first embodiment of the present invention is explained below with reference to FIG. 2 to FIG. 7.

Figure 2:
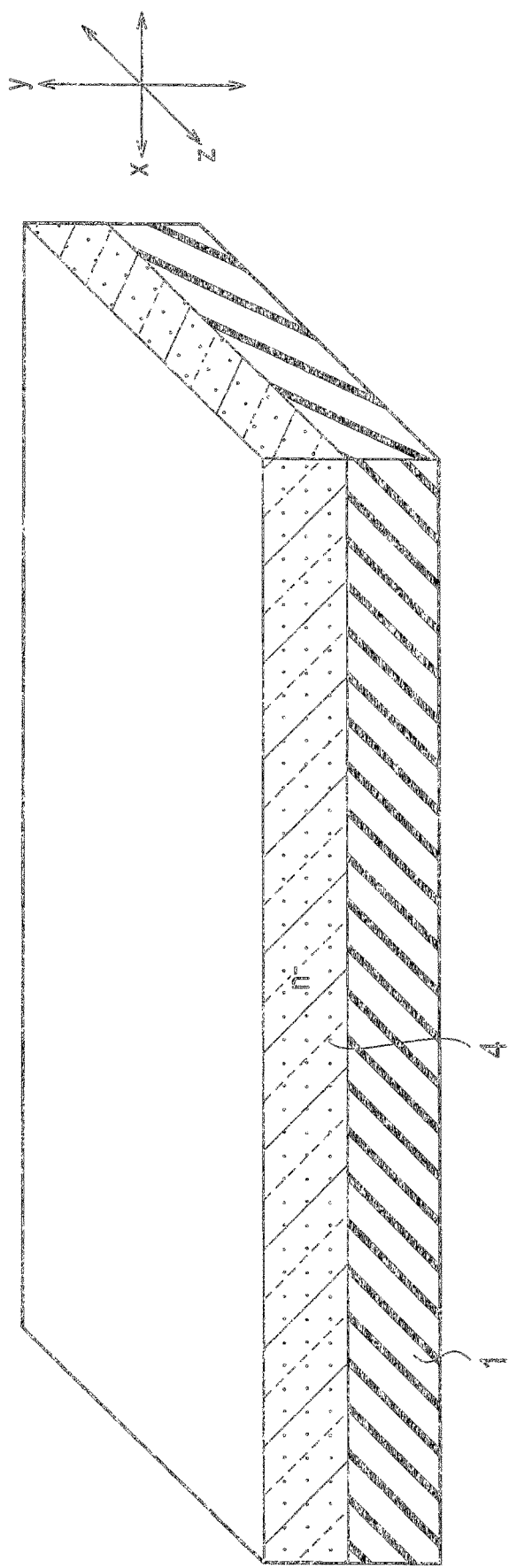
FIG. 2 is a perspective view for explaining a method of manufacturing the semiconductor device according to the first embodiment of the present invention.

First, the substrate 1 is prepared as shown in FIG. 2. The substrate 1 is an insulating substrate formed of undoped silicon carbide and has a thickness of several tens to several hundreds of micrometers. An n$^-$-type silicon carbide epitaxial layer is formed as the drift region 4 on the substrate 1. Here, silicon carbide has several polytypes (polymorphism). The present embodiment is illustrated with an example of using silicon carbide of a common 4H polytype. The drift region 4 is formed, for example, to have an impurity concentration in a range of $1\times10^{14}$ to $1\times10^{18}$ cm$^{-3}$ and a thickness of several to several tens of micrometers.

Figure 3:
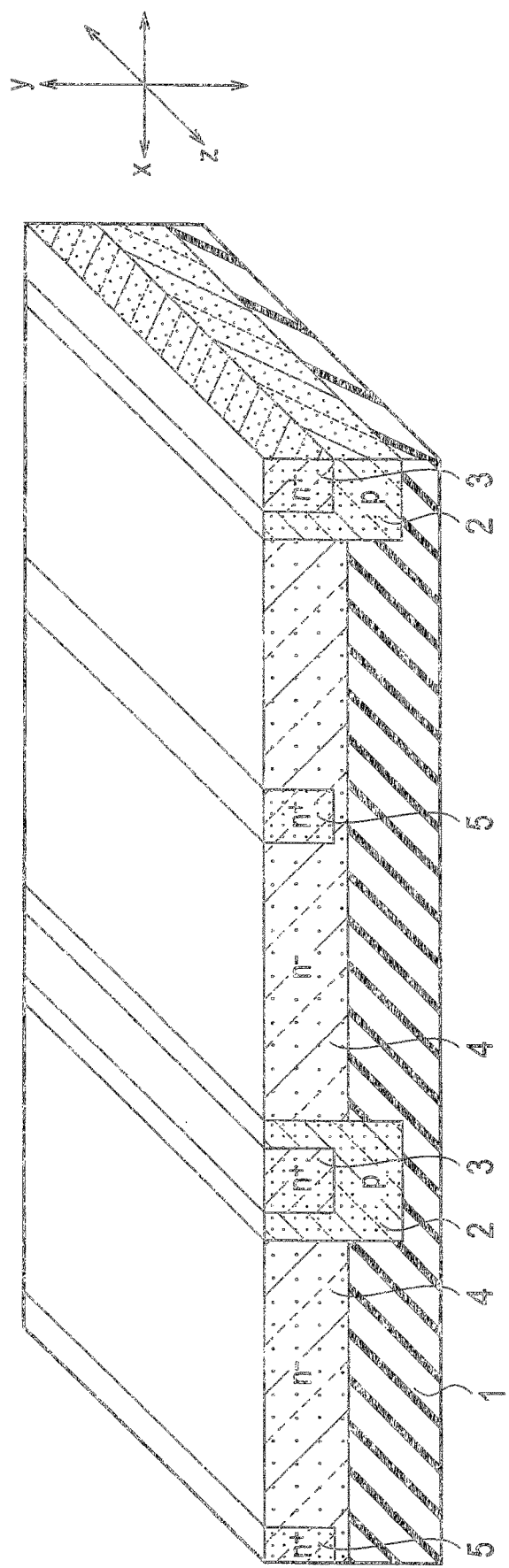
FIG. 3 is a perspective view continued from FIG. 2 for explaining the method of manufacturing the semiconductor device according to the first embodiment of the present invention.

Next, as shown in FIG. 3, the p-type well region 2, the n$^+$-type source region 3 and the n$^+$-type drain region 5 are formed in the drift region 4. The well region 2 is preferably formed first. Then, the source region 3 and the drain region 5 may be formed simultaneously. The well region 2, the source region 3 and the drain region 5 are formed by an ion injection method. In order to mask the drift region 4 excluding regions into which ions are injected, a mask material may be formed on the drift region 4 in the following steps. The mask material used may be a silicon oxide film ($SiO_2$ film). The deposition may be performed by a thermal CVD method or a plasma CVD method. Next, a resist is applied on the mask material and then patterned by common photolithography. The patterned resist is used as a mask so as to selectively remove part of the mask material by etching. The etching performed may be wet etching using hydrofluoric acid or dry etching such as reactive ion etching (RIE). The resist is then removed by use of oxygen plasma or sulfuric acid. Next, by use of the mask material as a mask, p-type and n-type impurities are injected into the drift region 4 by an ion injection method so as to form the p-type well region 2 and the $n^+$-type source region 3. The p-type impurities may be aluminum (Al) or boron (B). The n-type impurities may be nitrogen (N). Here, the ion injection is performed in a state where the substrate is heated to approximately 600° C. so as to prevent crystal defect from being caused in the injection regions. After the ion injection is carried out, the mask material is removed by, for example, wet etching using hydrofluoric acid. The impurities injected by the ion injection method are then activated by heat treatment (annealing). The heat treatment may be performed at, for example, 1700° C. and preferably under an argon (Ar) or nitrogen (N) atmosphere. The impurity concentration of each of the source region 3 and the drain region 5 is preferably in the range of $1\times10^{18}$ to $1\times10^{21}$ $cm^{-3}$, and the injection depth is shallower than the first main surface of the drift region 4. The impurity concentration of the well region 2 is preferably in the range of $1\times10^{15}$ to $1\times10^{19}$ $cm^{-3}$, and the injection depth is deeper than the first main surface of the drift region 4 so that the edge of the well region 2 reaches the inside of the substrate 1. When the thickness of the drift region 4 is 1 μm or greater, injection energy may be at a level of MKeV or greater.

Figure 4:
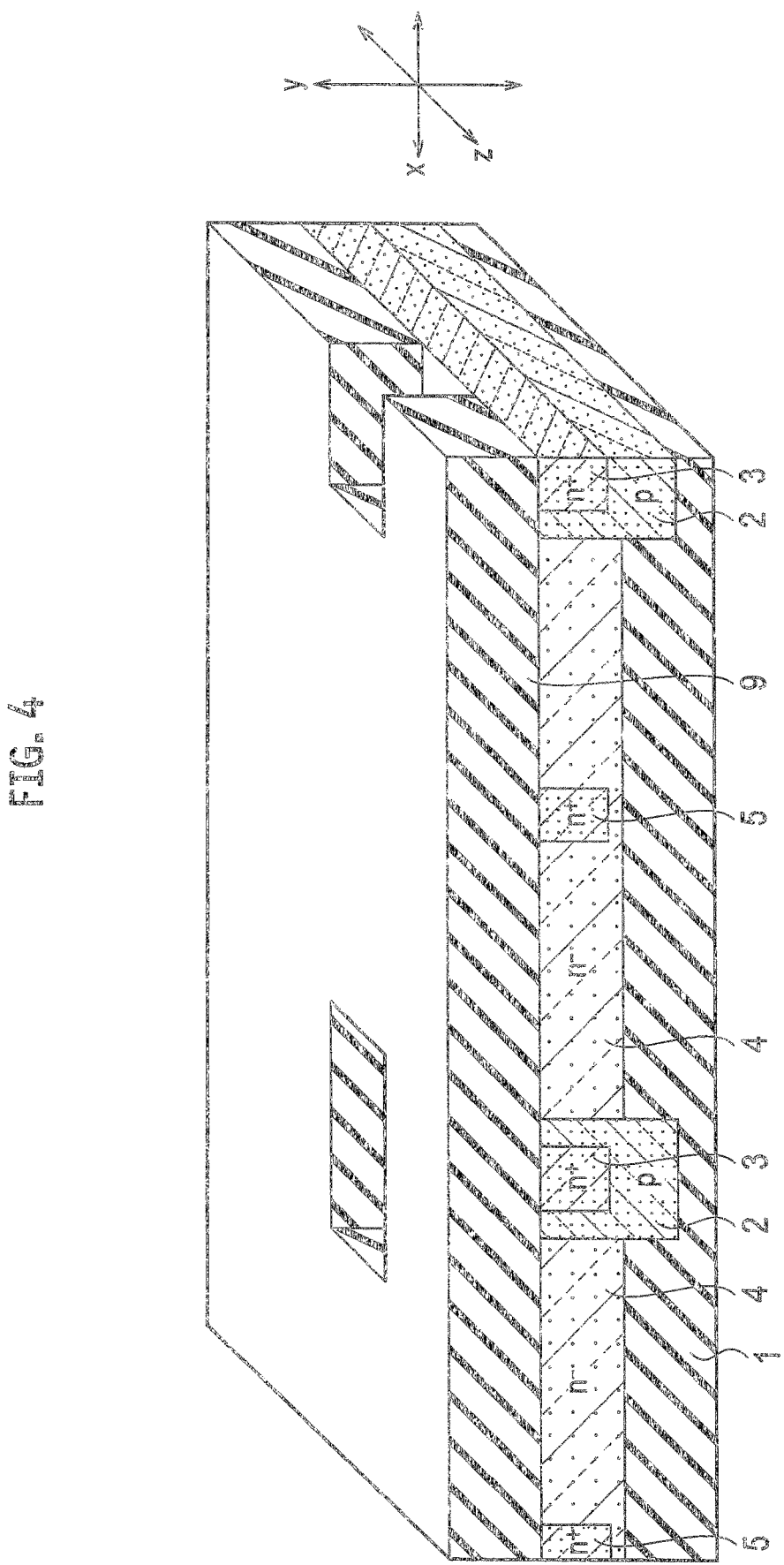
FIG. 4 is a perspective view continued from FIG. 3 for explaining the method of manufacturing the semiconductor device according to the first embodiment of the present invention.

Next, as shown in FIG. 4, a mask material 9 is formed in order to form the gate groove 8 in the drift region 4. The mask material 9 may be obtained in a manner such that an insulating film is patterned as in the case of the mask material used in the step shown in FIG. 3. Then, the mask material 9 is used as a mask to form the gate groove 8. Here, the structure after the gate groove 8 is formed is not shown in the drawing. The gate groove 8 is formed preferably by dry etching such as RIE. The depth of the gate groove 8 is shallower than the source region 3. The mask material 9 is removed after the gate groove 8 is formed. For example, when the mask material 9 is a silicon oxide film, the mask material 9 is removed by hydrofluoric acid cleaning.

Figure 5A:
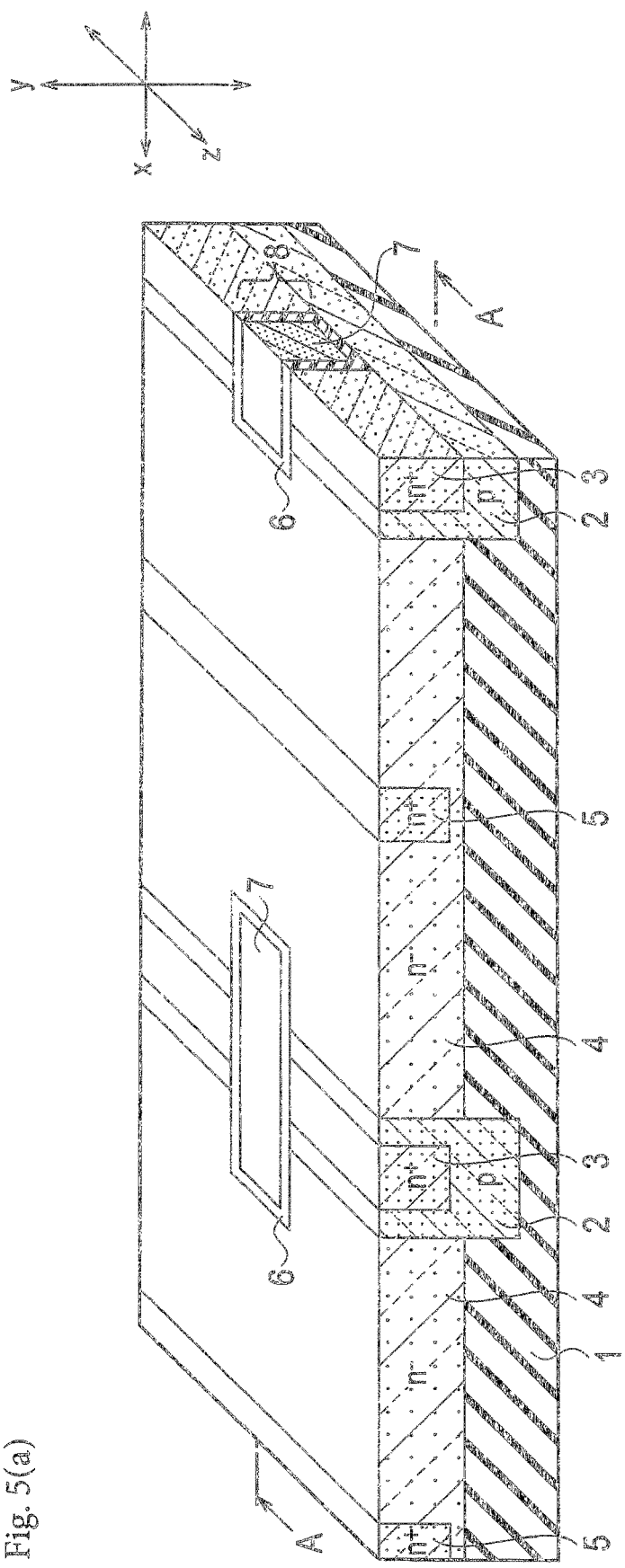
FIG. 5(a) is a perspective view continued from FIG. 4 for explaining the method of manufacturing the semiconductor device according to the first embodiment of the present invention.
Figure 5B:
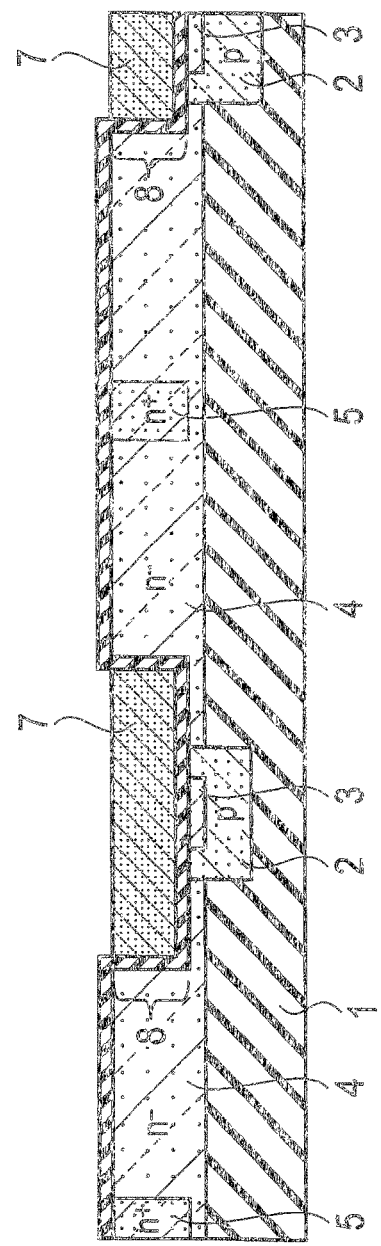
FIG. 5(b) is a cross-sectional view taken along line A-A in FIG. 5(a)

Next, as shown in FIG. 5(a) and FIG. 5(b), the gate insulating film 6 and the gate electrode 7 are formed. FIG. 5(b) is a cross-sectional view taken along line A-A in FIG. 5(a). In particular, the gate insulating film 6 is first formed on surfaces of the drift region 4 and the gate groove 8 by a thermal oxidation method or a deposition method. For example, in the case of using the thermal oxidation method, the substrate is heated to approximately 1100° C. under an oxygen atmosphere so that a silicon oxide film is formed at all the portions of the substrate where oxygen comes into contact. The gate insulating film 6 thus formed may be subjected to annealing at approximately 1000° C. under an atmosphere of nitrogen, argon or nitrous oxide ($N_2O$) in order to decrease an interfacial level at the interface between the well region 2 and the gate insulating film 6. Next, the material of which the gate electrode 7 is formed is deposited on the surface of the gate insulating film 6. The material of which the gate electrode 7 is formed is commonly polysilicon, and the present embodiment is also illustrated with polysilicon. The polysilicon may be deposited by a low pressure CVD method. The deposition thickness of the polysilicon is set to be greater than half of the width of the gate groove 8 so as to fill the gate groove 8 completely with the polysilicon. For example, when the width of the gate groove 8 is 2 μm, the deposition thickness of the polysilicon is thicker than 1 μm. The deposited polysilicon is then subjected to annealing in $POCl_3$ at approximately 950° C. so as to form n-type polysilicon and provide the gate electrode 7 with electric conductivity. Next, the polysilicon of the gate electrode 7 is subjected to etching such as isotropic etching or anisotropic etching. The etching amount is set such that the polysilicon remains in the gate groove 8. For example, when the width of the gate groove 8 is 2 μm, and the polysilicon is deposited with the thickness of 1.5 μm, the etching amount is preferably 1.5 μm. Here, several percent of overetching with respect to the polysilicon with the thickness of 1.5 μm is a permissible level for etching control. FIG. 5(a) and FIG. 5(b) each show the structure after the polysilicon is subjected to etching. Although the depth of the gate groove 8 is shown differently between FIG. 5(a) and FIG. 5(b), the bottom of the gate groove 8 may conform to that of the source region 3 as shown in FIG. 5(a) or may be shallower than that of the source region 3 as shown in FIG. 5(b).

Next, as shown in FIG. 6(a), an interlayer insulating film 10 and contact holes 11 for electrodes are formed. FIG. 6(b) shows the positions of the contact holes 11 as viewed from above. FIG. 6(b) does not show the interlayer insulating film 10 for convenience of explanation. The interlayer insulating film 10 is generally preferably a silicon oxide film and may be deposited by a thermal CVD method or a plasma CVD method. After the interlayer insulating film 10 is deposited, a resist is applied on the interlayer insulating film 10 and then patterned by common photolithography (not shown in the drawings). The patterned resist is used as a mask so as to selectively remove part of the interlayer insulating film 10 by wet etching using hydrofluoric acid or dry etching such as reactive ion etching (RIE) to form the contact holes 11. The resist is then removed by use of oxygen plasma or sulfuric acid. FIG. 6(a) and FIG. 6(b) each show the configuration after the contact holes 11 are formed.

Figure 7:
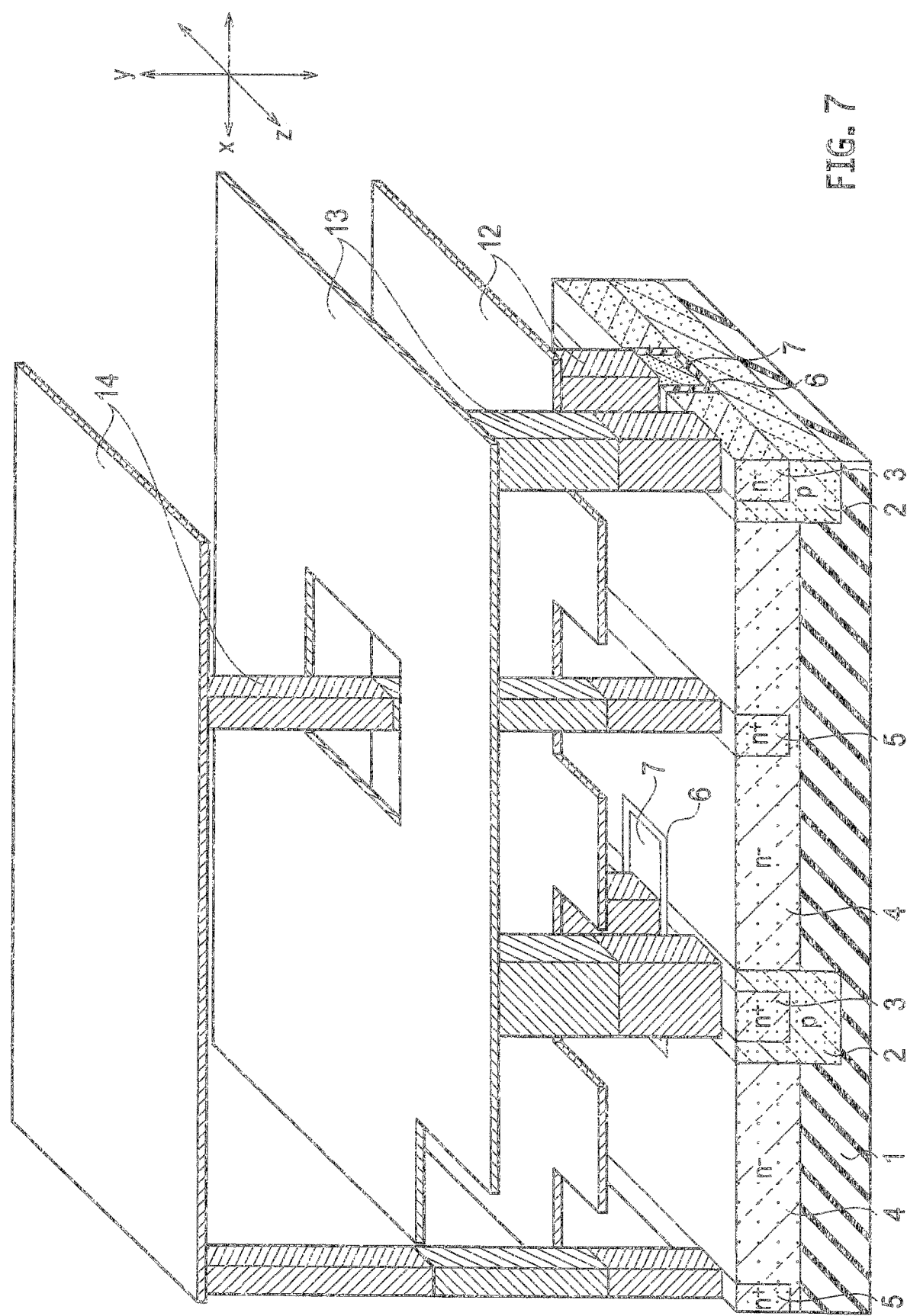
FIG. 7 is a perspective view continued from FIG. 6(a) for explaining the method of manufacturing the semiconductor device according to the first embodiment of the present invention.

After the contact holes 11 are formed, gate wiring 12, source wiring 13 and drain wiring 14 are formed, as shown in FIG. 7. FIG. 7 does not show any interlayer insulating film between the layers of the gate wiring 12, the source wiring 13 and the drain wiring 14 for convenience of explanation. The wiring material used may be metal such as titanium (Ti), nickel (Ni) or molybdenum (Mo). A specific method of forming the gate wiring 12, the source wiring 13 and the drain wiring 14 by use of Ti is explained below. First, Ti is deposited by, for example, MOCVD. Next, Ti is subjected to selective etching by use of a resist as a mask. Next, the interlayer insulating film between the gate wiring 12 and the source wiring 13 is deposited, and the contact holes are formed. The interlayer insulating film is deposited preferably by sputtering, and the contact holes may be formed in the same manner as the step shown in FIG. 6(a). Next, a metal material for the source wiring 13 is deposited and subjected to etching in the same manner as in the case of the gate wiring 12. Then, the interlayer insulating film between the source wiring 13 and the drain wiring 14 is deposited, the contact holes are formed, and a metal material for the drain wiring 14 is further deposited. FIG. 7 shows the semiconductor device after the drain wiring 14 is formed. Accordingly, the semiconductor device shown in FIG. 1 is completed through the above-described steps.

The semiconductor device shown in FIG. 1 manufactured by the method according to the first embodiment of the present invention can exert improved voltage resistance.

First Modified Example

The first embodiment of the present invention exemplified the case where the substrate 1 is an insulating or semi-insulating substrate. The first embodiment is further illustrated with a modified example in which the substrate 1 is the same conductivity type (n-type) semiconductor substrate as the drift region 4. The substrate 1 is formed of, for example, silicon carbide, and the impurity concentration of the substrate 1 is lower than that of the drift region 4. The operation and fabrication methods for the semiconductor device in this example are substantially the same as those for the semiconductor device in which the substrate 1 is an insulating or semi-insulating substrate.

If the substrate 1 is a conductivity type (p-type) semiconductor substrate different from the drift region 4, a depletion layer extends from the substrate 1 toward the drift region 4 when a current flows from the source region 3 to the drift region 4 via the well region 2 in which a channel is formed when the semiconductor device is turned on. As a result, a passage of the current narrows, and the current thus decreases. Further, the substrate 1, if being a conductivity type (p-type) semiconductor substrate different from the drift region 4, should be designed with close attention to voltage resistance between the substrate 1 and the drift region 4. On the other hand, the substrate 1 that is the same conductivity type (n-type) semiconductor substrate as the drift region 4 can allow the passage of the current to spread into the substrate 1. Accordingly, the current increases, so that a reduction in loss can be expected. Furthermore, such a substrate can facilitate a designing process in view of voltage resistance between the substrate 1 and the drift region 4, so that a semiconductor device having high voltage resistance can be provided.

Second Modified Example

Figure 8:
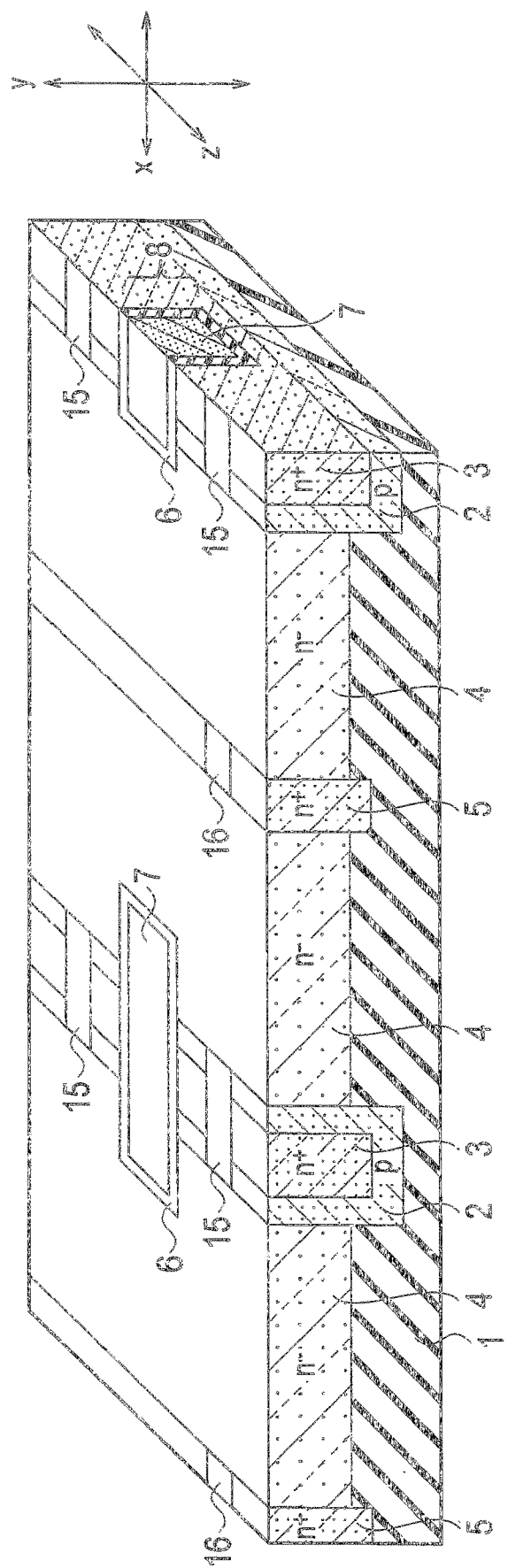
FIG. 8 is a perspective view showing a modified example of the semiconductor device according to the first embodiment of the present invention.

FIG. 8 shows a semiconductor device having a structure modified from that shown in FIG. 1. The semiconductor device shown in FIG. 8 differs from that shown in FIG. 1 in that the source region 3 and the drain region 5 extend to the inside of the substrate 1. A method of manufacturing the semiconductor device shown in FIG. 8 differs from that in the first embodiment in that, when the source region 3 and the drain region 5 are formed by ion injection, impurities are injected deeply below the first main surface of the drift region 4, but other steps are substantially the same.

In the semiconductor device shown in FIG. 8, since the source region 3 extends to the inside of the substrate 1, a lateral area of the source region 3 perpendicular to the second main surface of the drift region 4 increases. Accordingly, a current can be increased when the semiconductor device is turned on, and a loss can be reduced.

In addition, since the drain region 5 extends to the inside of the substrate 1, a lateral area of the drain region 5 perpendicular to the second main surface of the drift region 4 increases. Accordingly, a current can be increased when the semiconductor device is turned on, and a loss can be reduced.

In the semiconductor device shown in FIG. 8, both the source region 3 and the drain region 5 extend to the inside of the substrate 1, which can take full advantage of the lateral areas of the source region 3 and the drain region 5 so that a large amount of current can flow in the semiconductor device. Although the semiconductor device shown in FIG. 8 is illustrated with the example in which both the source region 3 and the drain region 5 extend to the inside of the substrate 1, the semiconductor device in which either the source region 3 or the drain region 5 extends to the inside of the substrate 1 can also allow a large amount of current to flow therethrough as compared with the structure shown in FIG. 1.

Third Modified Example

Figure 9:
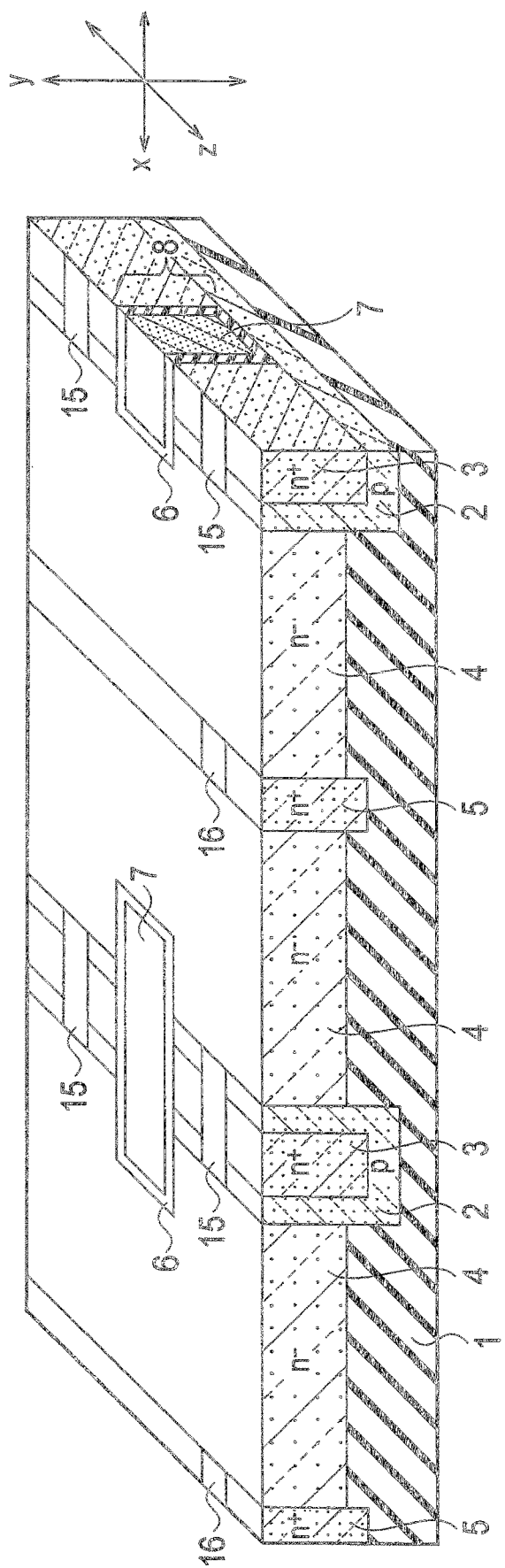
FIG. 9 is a perspective view showing another modified example of the semiconductor device according to the first embodiment of the present invention.

FIG. 9 shows a semiconductor device having a structure modified from that shown in FIG. 8. The semiconductor device shown in FIG. 9 differs from that shown in FIG. 8 in that the gate groove 8 extends downward more deeply so that part of the gate groove 8 penetrates into the substrate 1. The operation of the semiconductor device shown in FIG. 9 is substantially the same as that of the semiconductor device shown in FIG. 8. The fabrication method for the semiconductor device shown in FIG. 9 differs from that for the semiconductor device shown in FIG. 8 in the process of forming the gate groove 8 extending deeply below the first main surface of the drift region 4, but other steps are substantially the same.

In the semiconductor device shown in FIG. 9, part of the gate groove 8 extends to the inside of the substrate 1 so that the bottom surface and corner portions defined by the bottom surface and side surfaces of the gate groove 8 are located inside the substrate 1. When the substrate 1 is an insulating substrate or an n-type semiconductor substrate of which impurity concentration is lower than that of the drift region 4, an electric field concentration at the bottom surface and corner portions of the gate groove 8 can be reduced more than that in the structure shown in FIG. 1 or FIG. 8, so as to improve the voltage resistance. In addition, the structure shown in FIG. 1 or FIG. 8 includes a region where part of the bottom surface of the gate groove 8 is in contact with the substrate 1 via the gate insulating film 6. A capacitance generated in this region is a gate-drain capacitance, which causes a loss at the time of operating the semiconductor device. In the substrate 1 shown in FIG. 9, however, there is little capacitance in the above-mentioned region in contact with the substrate 1 when the substrate 1 is an insulating substrate, so as to reduce a loss at the time of operating the semiconductor device.

Fourth Modified Example

Figure 10:
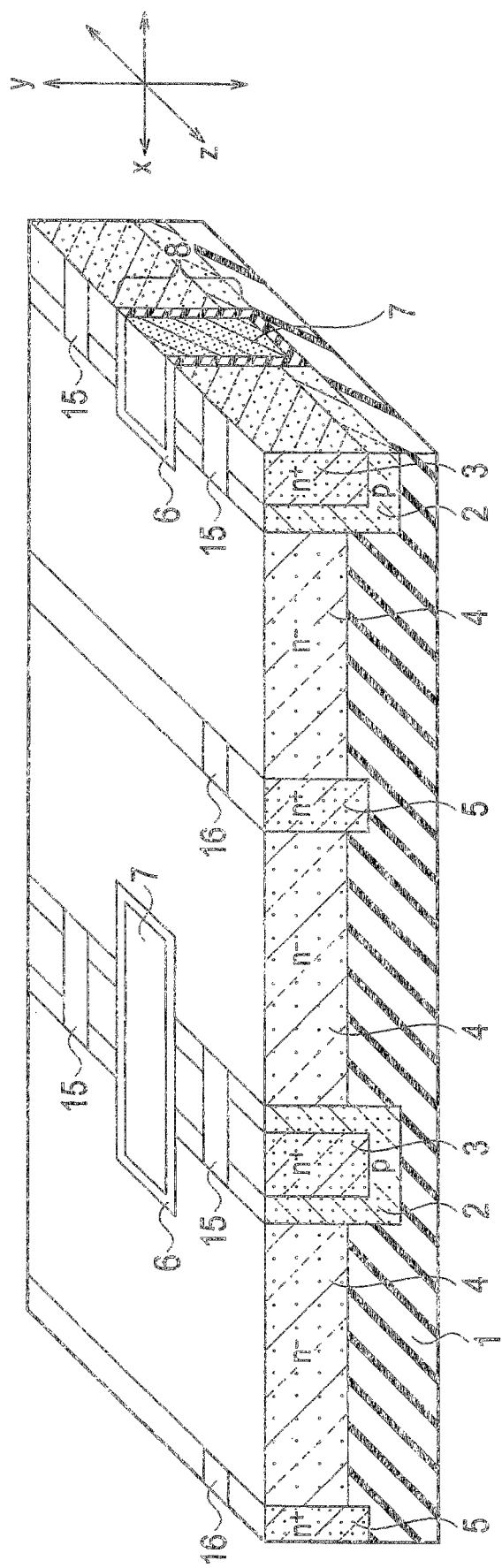
FIG. 10 is a perspective view showing still another modified example of the semiconductor device according to the first embodiment of the present invention.

FIG. 10 shows a semiconductor device having a structure modified from that shown in FIG. 9. The semiconductor device shown in FIG. 10 differs from that shown in FIG. 9 in that the bottom of the gate groove 8 penetrates into the well region 2. The operation of the semiconductor device shown in FIG. 10 is substantially the same as that of the semiconductor device shown in FIG. 9. The fabrication method for the semiconductor device shown in FIG. 10 differs from that for the semiconductor device shown in FIG. 9 in the process of forming the gate groove 8 extending downward more deeply than the source region 3, but other steps are substantially the same.

In the semiconductor device shown in FIG. 10, when the gate groove 8 is deeper than the source region 3 in the direction perpendicular to the second main surface of the drift region 4, and the bottom surface of the gate groove 8 is located in the well region 2, a gate-source capacitance generated in a region where the bottom surface of the gate groove 8 is in contact with the well region 2 via the gate insulating film 6 varies depending on a voltage of the gate electrode 7. For example, when the well region 2 is a p-type semiconductor, and a gate voltage is negative, a depletion layer extends in the well region 2 so that the gate-source capacitance generated at the bottom surface of the gate groove 8 is small. On the other hand, when the gate voltage is positive and greater than or equal to a threshold voltage of the semiconductor device, the well region 2 is reversed, and the gate-source capacitance generated at the bottom surface of the gate groove 8 is maximized and is a capacitance in the gate insulating film 6. In the structure as shown in FIG. 1, FIG. 8 or FIG. 9 in which the bottom of the gate groove 8 is located in the source region 3, a capacitance in a region defined by the gate electrode 7, the gate insulating film 6 and the source region 3 does not vary depending on the gate voltage but is constantly the capacitance in the gate insulating film 6. The structure shown in FIG. 10, however, can decrease the gate-source capacitance at the bottom of the gate groove 8 so that a semiconductor device with a loss reduced can be provided.

Fifth Modified Example

Figure 11:
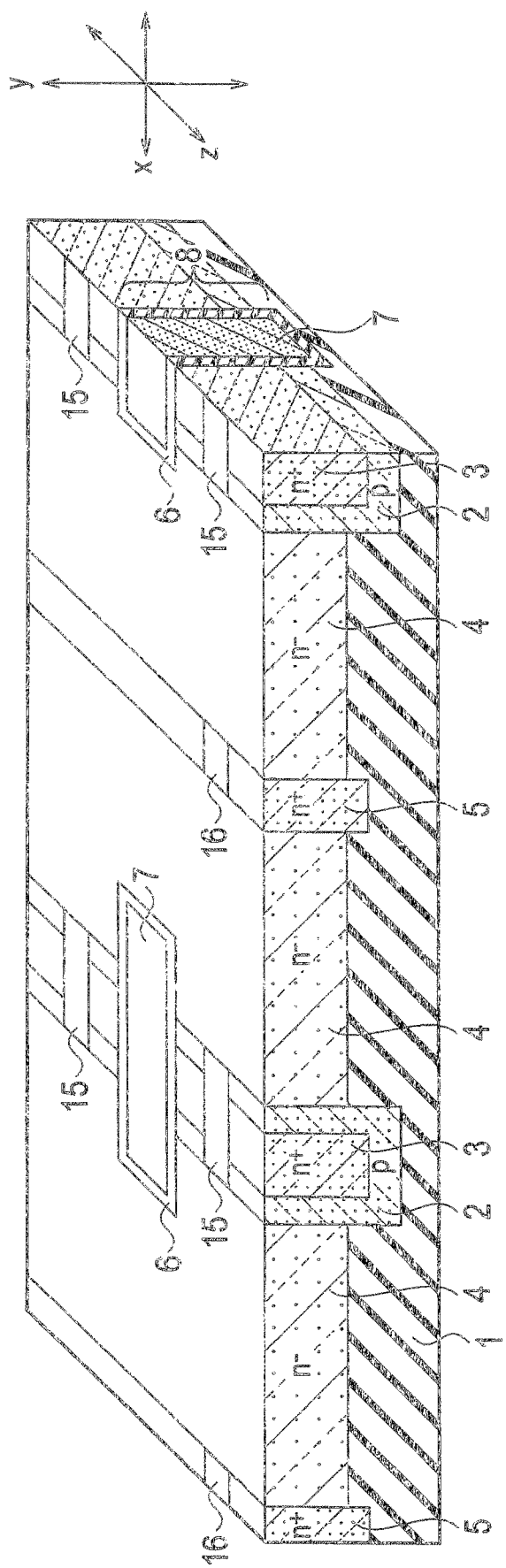
FIG. 11 is a perspective view showing still another modified example of the semiconductor device according to the first embodiment of the present invention.

FIG. 11 shows a semiconductor device having a structure modified from that shown in FIG. 10. The semiconductor device shown in FIG. 11 differs from that shown in FIG. 10 in that the bottom of the gate groove 8 is located below the well region 2. The fabrication method for the semiconductor device shown in FIG. 11 differs from that for the semiconductor device shown in FIG. 10 in the step of forming the gate groove 8 having a greater depth than the well region 2.

Here, if the bottom of the gate groove 8 is located in the drift region 4, and the semiconductor device is formed of particularly a SiC material in which the gate insulating film 6 is a thermal silicon oxide film, the thickness of the thermal silicon oxide film varies depending on a crystal face of SiC. For example, when the surface of the drift region 4 is a (0001) plane, the oxide film formed at the bottom surface of the gate groove 8 parallel to the second main surface of the drift region 4 is thinner than the oxide film formed at the side surface perpendicular to the second main surface of the drift region 4. As a result, the voltage resistance between the gate electrode 7 and the source electrodes 15 is decreased at the bottom surface of the gate groove 8. Further, a gate-source capacitance generated at the bottom surface of the gate groove 8 increases and accounts for a large proportion of the entire gate-source capacitance, which may increase a loss at the time of operating the semiconductor element.

According to the structure shown in FIG. 11, however, the bottom surface of the gate groove 8 located below the well region 2 is in contact with the substrate 1 but not electrically connected to the source region 3. Therefore, a gate-source capacitance between the gate electrode 7 and the source electrodes 15 is hardly generated at the bottom surface of the gate groove 8. A decrease of the gate-source capacitance generated at the bottom surface of the gate groove 8 leads to a great decrease of the entire gate-source capacitance, so that a semiconductor device having high reliability with a loss reduced can be provided. Further, when the substrate 1 is an insulating substrate, the gate-drain capacitance generated at the bottom surface of the gate groove 8 can also be decreased, so that the semiconductor device with a loss reduced can be ensured.

Second Embodiment

Figure 12:
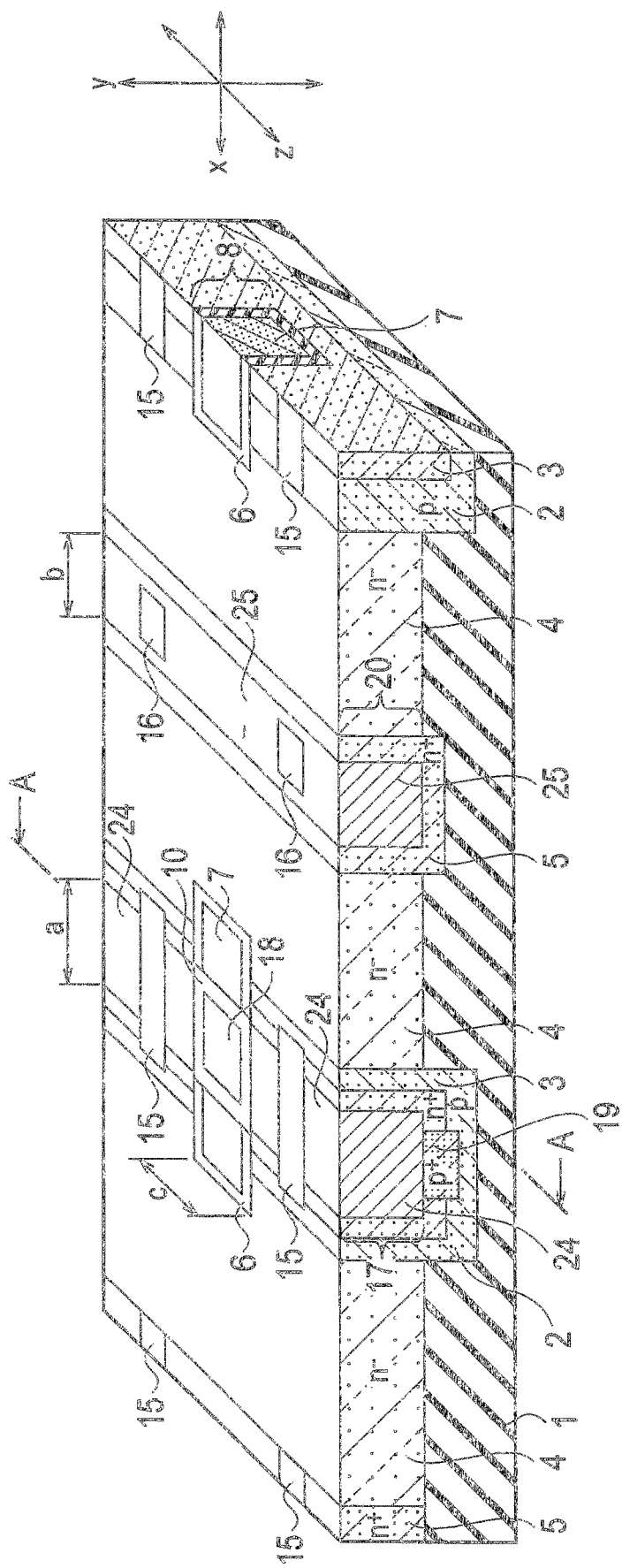
FIG. 12 is a perspective view showing an example of a semiconductor device according to a second embodiment of the present invention.

FIG. 12 is a perspective view schematically showing a configuration of a semiconductor device according to a second embodiment of the present invention. FIG. 12 does not show electrode wiring for convenience of explanation. The configuration of the electrode wiring is the same as that shown in FIG. 7.

The semiconductor device according to the second embodiment of the present invention differs from that according to the first embodiment in that a source groove 17 is formed in the source region 3, and a drain groove 20 is formed in the drain region 5, as shown in FIG. 12.

A bottom portion of the source groove 17 is provided with a p+-type well contact region 19 having a higher impurity concentration than the well region 2 and in contact with the well region 2. An electrical conducting layer 24 is laid in the source groove 17. The electrical conducting layer 24 has the same potential as the source electrodes 15 and is brought in ohmic contact with the source region 3 and the well contact region 19. An electrical conducting layer 25 is laid in the drain groove 20. The electrical conducting layer 25 has the same potential as the drain electrodes 16 and is brought in ohmic contact with the drain region 5. The material used for the electrical conducting layers 24, 25 may be an electrical conducting material such as nickel (Ni), titanium (Ti) or molybdenum (Mo).

As shown in FIG. 12, when the width of the source groove 17 is defined as "a", the width of the drain groove 20 is defined as "b", and the width of the gate groove 8 is defined as "c", the relationship of a>b>c is fulfilled. That is, the width a of the source groove 17 is greater than the width b of the drain groove 20, and the width b of the drain groove 20 is greater than the width c of the gate groove 8.

Figure 13:
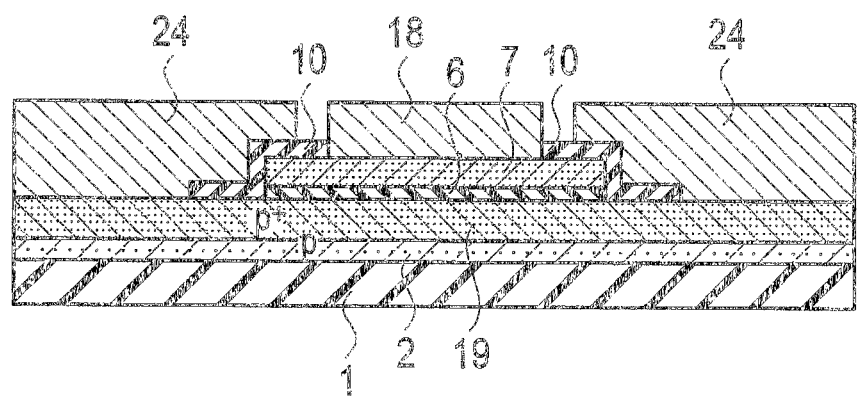
FIG. 13 is a cross-sectional view taken along line A-A in FIG. 12.

FIG. 13 is a partial cross-sectional view of the source groove 17 taken along line A-A in FIG. 12. As shown in FIG. 13, the gate electrode 7 is in ohmic contact with an electrical conducting layer 18 and has the same potential as the electrical conducting layer 18. The gate electrode 7 is insulated from the electrical conducting layer 24 with the interlayer insulating film 10.

The other configurations of the semiconductor device according to the second embodiment of the present invention are substantially the same as those according to the first embodiment. The operation of the semiconductor device according to the second embodiment of the present invention is substantially the same as that of the semiconductor device according to the first embodiment.

According to the second embodiment of the present invention, the edge of the well region 2 extends to the inside of the substrate 1 so as to significantly reduce an electric field concentration caused at the edge of the well region 2 and prevent a decrease in voltage resistance. Further, since the edge of the well region 2 extends to the inside of the substrate 1, and the impurity concentration of the substrate 1 is lower than that of the drift region 4, a breakdown voltage between the substrate 1 and the well region 2 is greater than that between the drift region 4 and the well region 2 when the drift region 4 and the substrate 1 have the same length in the direction parallel to the second main surface of the drift region 4. Accordingly, the voltage resistance can be further improved as compared with the structure described in Japanese Patent Unexamined Publication No. 2001-274398.

Further, since the substrate 1 is a semi-insulating substrate or an insulating substrate, the edge of the well region 2 is formed in an insulating region. Thus, the voltage resistance of the edge of the well region 2 can greatly be increased so that the semiconductor device having high voltage resistance can be ensured.

Further, since the material used for the substrate 1 is silicon carbide exerting high insulating performance and having high heat conductivity, the substrate 1 with the rear surface adhered to a cooling system via an electrical conducting material can efficiently radiate heat caused by a current generated when the semiconductor device is turned on, so as to cool the semiconductor device efficiently. In addition, since silicon carbide is a semiconductor having a wide bandgap and has a low intrinsic carrier concentration, the semiconductor device effectively exerting high insulating performance and having high voltage resistance can be ensured.

Further, since the source region 3 includes the source groove 17, the injection depth of impurities can be decreased when the source region 3 and the well region 2 are formed, as compared with the case of the first embodiment. Since high injection energy is not required, the semiconductor device provided can contribute to a reduction in cost. Further, the electrical conducting layer 24 is laid in the source groove 17 and has the same electrical potential as the source region 3. Here, if the source groove 17 is not provided, a resistance component of the source region 3 is applied in the direction perpendicular to the substrate 1. Such a resistance component acts to decrease a current when the semiconductor device operates, which leads to a decrease of the current. When the electrical conducting layer 24 is laid in the source groove 17, however, the resistance component of the source region 3 in the perpendicular direction is aligned in parallel with a resistance component of the electrical conducting layer 24. Since resistance of the electrical conducting layer 24 is generally less than resistance of a semiconductor, the parallel resistance components can be decreased. Accordingly, the semiconductor device with a loss reduced can be ensured.

Further, since the width a of the source groove 17 is greater than the width c of the gate groove 8, the source groove 17 and the gate groove 8 can be formed simultaneously, and the source region 3 and the well region 2 can be formed with no mask used, so as to facilitate the manufacturing process. As a specific fabrication method, the gate groove 8 and the source groove 17 are formed simultaneously by use of a mask pattern. For example, when the width c of the gate groove 8 is 1 µm, and the width a of the source groove 17 is 2 µm, 0.5 µm of a silicon oxide film is deposited thereon by a LPCVD method after the gate groove 8 and the source groove 17 are formed. As a result, the gate groove 8 is filled completely with the silicon oxide film, while the source groove 17 is not completely filled with the silicon oxide film. Next, n-type impurities are injected by oblique ion injection so as to form the source region 3. Then, p-type impurities are injected by oblique ion injection so as to form the well region 2. Accordingly, the gate groove 8 and the source groove 17 can be formed simultaneously, and the source region 3 and the well region 2 can be formed by self-alignment. Namely, a semiconductor device manufactured by a simple process at low cost can be provided.

Further, since the drain region 5 includes the drain groove 20, the injection depth of impurities can be decreased when the source region 3 and the well region 2 are formed, as compared with the case of the first embodiment. Since high injection energy is not required, the semiconductor device provided can contribute to a reduction in cost. Further, the electrical conducting layer 25 is laid in the drain groove 20 and has the same electrical potential as the drain region 5.

Here, if the drain groove 20 is not provided, a resistance component of the drain region 5 is applied in the direction perpendicular to the second main surface of the drift region 4. Such a resistance component acts to decrease a current when the semiconductor device operates, which leads to a decrease of the current. When the electrical conducting layer 25 is laid in the drain groove 20, however, the resistance component of the drain region 5 in the perpendicular direction is aligned in parallel with a resistance component of the electrical conducting layer 25. Since resistance of the electrical conducting layer 25 is generally less than resistance of a semiconductor, the parallel resistance components can be decreased. Accordingly, the semiconductor device with a loss reduced can be ensured.

Further, since the width b of the drain groove 20 is greater than the width c of the gate groove 8, the drain groove 20 and the gate groove 8 can be formed simultaneously, and the drain region 5 can be formed with no mask used, so as to facilitate the manufacturing process. In particular, the drain groove 20 and the gate groove 8 are formed simultaneously by use of a mask pattern. For example, when the width c of the gate groove 8 is 1 µm and the width b of the drain groove 20 is 2 µm, 0.5 µm of a silicon oxide film is deposited thereon by a LPCVD method after the gate groove 8 and the drain groove 20 are formed. As a result, the gate groove 8 is filled completely with the silicon oxide film, while the drain groove 20 is not completely filled with the silicon oxide film. Next, n-type impurities are injected by oblique ion injection so as to form the drain region 5. Accordingly, the drain region 5 can be formed by self-alignment. Namely, a semiconductor device manufactured by a simple process at low cost can be provided.

Further, the drain groove 20 is formed in the drain region 5, and the source groove 17 is formed in the source region 3. The source groove 17 and the drain groove 20 are provided with the respective electrically conducting layers 24, 25, and the electrically conducting layer 24 and the electrically conducting layer 25 have the same potential as the source region 3 and the drain region 5, respectively. The effect derived from this structure is explained with reference to the drain region 5 as an example. If the drain groove 20 is not provided, the resistance component of the drain region 5 is applied in the direction perpendicular to the second main surface of the drift region 4. Such a resistance component acts to decrease a current when the semiconductor device operates, which leads to a decrease of the current. When the drain groove 20 is filled with the electrical conducting layer 25, however, the resistance component of the drain region 5 in the perpendicular direction is aligned in parallel with the resistance component of the electrical conducting layer 25. Since the resistance of the electrical conducting layer 25 is generally less than resistance of a semiconductor, the parallel resistance components can be decreased. The same effect as the drain region 5 can be ensured in the source region 3, and the current can be increased when the semiconductor device is turned on. Namely, the semiconductor device with a loss reduced can be ensured.

Further, since the width a of the source groove 17 is greater than the width b of the drain groove 20, and the width b of the drain groove 20 is greater than the width c of the gate groove 8, the gate groove 8, the source groove 17 and the drain groove 20 can be formed simultaneously, and the source region 3, the drain region 5 and the well region 2 can be formed by self-alignment. Accordingly, a semiconductor device manufactured by a simple process at low cost with high reliability but no concern about misalignment can be provided.

Further, since the source groove 17 is provided with the well contact region 19 at the bottom portion thereof, the well contact region 19 can be formed by self-alignment, so that the semiconductor device manufactured by a simple process at low cost with high reliability but no concern about misalignment can be ensured. When the well contact region 19 is a p-type region with a high impurity concentration, the well contact region 19 can easily be brought in ohmic contact with the electrical conducting layer 24, the contact resistance thereof can be reduced, and the potential of the well region 2 can easily be controlled by the source electrode 15. Accordingly, the semiconductor device with high reliability can be ensured.

An example of a method of manufacturing the semiconductor device according to the second embodiment of the present invention is explained below with reference to FIG. 14(a) to FIG. 29.

First, the substrate 1 is prepared as shown in FIG. 14(a). The substrate 1 is an insulating substrate formed of undoped silicon carbide and has a thickness of several tens to several hundreds of micrometers. An n⁻-type silicon carbide epitaxial layer is formed as the drift region 4 on the substrate 1. Here, silicon carbide has several polytypes (polymorphism). The present embodiment is illustrated with an example of using silicon carbide of a common 4H polytype. The drift region 4 is formed, for example, to have an impurity concentration in a range of $1 \times 10^{14}$ to $1 \times 10^{18}$ $cm^{-3}$ and a thickness of several to several tens of micrometers.

Next, a step of forming the gate groove 8, the drain groove 20 and the source groove 17 simultaneously in the drift region 4 (hereinafter, referred to as "first step") is performed. FIG. 14(b) is a perspective view showing a state after the mask 9 is formed so as to form the gate groove 8, the drain groove 20 and the source groove 17 simultaneously. The mask material 9 may be obtained in a manner such that an insulating film is patterned as in the case of the mask material used in the step shown in FIG. 3. Then, the mask material 9 is used as a mask to form the gate groove 8, the drain groove 20 and the source groove 17 by, for example, dry etching. As shown in FIG. 14(b), when the width of the source groove 17 is defined as "a", the width of the drain groove 20 is defined as "b", and the width of the gate groove 8 is defined as "c", the gate groove 8, the drain groove 20 and the source groove 17 are formed so that the relationship of a>b>c is fulfilled. The respective cross-sectional views taken along line A-A, line B-B and line C-C in FIG. 14(b) are shown in FIG. 15(a) to FIG. 15(c). The subsequent steps are explained below with reference to the respective cross-sectional views.

After the first step, a step of depositing the mask material 21 (hereinafter, referred to as "second step") is performed. The mask material 21 used may be a silicon oxide film, and the deposition method may be a thermal CVD method, a plasma CVD method or a low pressure CVD method. In order to improve coverage of the film, the low pressure CVD method is preferable. The deposition thickness is one half or more of the width c of the gate groove 8 and less than one half of the width b of the drain groove 20. For example, when the width c of the gate groove 8 is 1 μm, and the width b of the drain groove 20 is 2 μm, the thickness of the mask material 21 is set to 0.5 μm or greater and less than 1 μm. FIG. 16(a) to FIG. 16(c) each show a state after the mask material 21 is deposited with the thickness set as described above. As shown in FIG. 16(a) to FIG. 16(c), the gate groove 8 is filled completely with the mask material 21, but the source groove 17 and the drain groove 20 are not completely filled with the mask material 21.

After the second step, a step of forming the drain region 5 and the source region 3 simultaneously (hereinafter, referred to as "third step") is performed. The third step uses an ion injection method. The mask material 21 deposited in the second step is used as a mask in the injection regions without being patterned by photolithography, which differs from the first embodiment. Since the source region 3 and the drain region 5 are an n-type, nitrogen (N) or phosphorus (N) may be used as n-type impurities. The ion injection is carried out in a state where the substrate is heated to approximately 600° C. so as to prevent crystal defect from being caused in the injection regions. The ion injection is also carried out in a manner such that a traveling direction of an ion beam is inclined at a fixed angle to the direction perpendicular to the main surface of the substrate 1 so that the impurities are injected also to side walls of the drain groove 20 and the source groove 17. The impurity concentration is preferably in the range of $1 \times 10^{18}$ to $1 \times 10^{21}$ $cm^{-3}$. The injection depth is greater than the thickness of the mask material 21 and less than the total thickness of the mask material 21 and the mask material 9. The reason for this is that the n-type impurities, if being injected deeply below the mask material 9, are injected further to the surface of the drift region 4. FIG. 17(a) to FIG. 17(c) each show a state of the semiconductor device after the third step is performed. As shown in FIG. 17(a) to FIG. 17(c), the n-type impurities are injected to the side walls and bottom portions of the source groove 17 and the drain groove 20.

After the third step, a step of depositing a mask material 22 (hereinafter, referred to as "fourth step") is performed. The mask material 22 used may be a silicon oxide film, and the deposition method may be a thermal CVD method, a plasma CVD method or a low pressure CVD method. In order to improve coverage of the film, the low pressure CVD method is preferable. The deposition thickness is set to greater than or equal to a value obtained in such a manner as to subtract the thickness of the mask material 21 from one half of the width b of the drain groove 20 and less than a value obtained in such a manner as to subtract the thickness of the mask material 21 from one half of the width a of the source groove 17. For example, when the width of the drain groove 20 is 2 μm, the thickness of the mask material 21 is set to 0.8 μm, and the width a of the source groove 17 is 3 μm, the thickness of the mask material 22 is set to 0.2 μm or greater and less than 0.7 μm. FIG. 18(a) to FIG. 18(c) each show a state after the mask material 22 is deposited with the thickness set as described above. As shown in FIG. 18(a) to FIG. 18(c), the gate groove 8 and the drain groove 20 are filled completely with the mask material 22, but the source groove 17 is still not completely filled with the mask material 22.

After the fourth step, a step of forming the well region 2 (hereinafter, referred to as "fifth step") is performed. This step uses an ion injection method. The patterning by photolithography is not performed on the injection regions, which differs from the first embodiment. The mask material 21 and the mask material 22 deposited in the second step and the fourth step are each used as a mask. Since the well region 2 is a p type, aluminum (Al) or boron (B) may be used as p-type impurities. The ion injection is carried out in a state where the substrate is heated to approximately 600° C. so as to prevent crystal defect from being caused in the injection regions. The ion injection is also carried out in a manner such that a traveling direction of an ion beam is inclined at a fixed angle to the direction perpendicular to the main surface of the substrate 1 so that the impurities are injected to the side walls and the bottom of the source groove 17. The impurity concentration is preferably in the range of $1 \times 10^{15}$ to $1 \times 10^{19}$ cm$^{-3}$. The injection depth is greater than the total thickness of the mask material 21, the mask material 22 and the source region and less than the total thickness of the mask material 21, the mask material 22 and the mask material 9. FIG. 19(a) to FIG. 19(c) each show a state of the semiconductor device after the fifth step is performed. As shown in FIG. 19(a) to FIG. 19(c), the p-type impurities are injected to the side walls and the bottom of the source groove 17.

After the fifth step, a step of forming the well contact region 19 (hereinafter, referred to as "sixth step") is performed. Before the sixth step, etching may be performed on the mask material 21 and the mask material 22. The etching is performed entirely on the mask materials, instead of selective etching by photolithography. When the mask material 21 and the mask material 22 are both a silicon oxide film, anisotropy dry etching such as reactive ion etching (RIE) is preferable. The etching thickness may be the total thickness of the mask material 21 and the mask material 22. FIG. 20(a) to FIG. 20(c) each show a sectional structure after the anisotropy dry etching is performed. As shown in FIG. 20(a) to FIG. 20(c), the gate groove 8 and the drain groove 20 are still filled completely with the mask material 21 and the mask material 22. Although the mask material 21 and the mask material 22 remain on the side walls of the source groove 17, the source region 3 is exposed on the bottom surface of the source groove 17. The mask material 9 also remains on the surface of the drift region 4. The sixth step is thus performed on the configuration described above to form the well contact region 19 by the ion injection method. Since the well contact region 19 is a p type, aluminum (Al) or boron (B) may be used as p-type impurities. The ion injection is carried out in a state where the substrate is heated to approximately 600° C. so as to prevent crystal defect from being caused in the injection regions. The ion injection is preferably carried out in a manner such that a traveling direction of an ion beam is set to the direction perpendicular to the substrate 1. Since the bottom portion of the source groove 17 is provided with the n-type source region 3, the concentration of the p-type impurities injected is preferably at least twice as much as the impurity concentration of the source region 3. Accordingly, the n-type source region 3 partly includes a p-type region in which the p-type impurities are injected. The injection depth may be deeper than the source region 3 and shallower than the well region 2. FIG. 21(a) to FIG. 21(c) each shows a state of the semiconductor device after the sixth step is performed.

Next, the mask material 9, the mask material 21 and the mask material 22 are removed. For example, when the mask material 9, the mask material 21 and the mask material 22 are a silicon oxide film, these materials can be removed by hydrofluoric acid cleaning. The impurities injected by ion injection are then activated by heat treatment (annealing). The heat treatment may be performed at approximately 1700° C. and preferably under an argon (Ar) or nitrogen (N) atmosphere. Next, the gate insulating film 6 is formed. FIG. 22(a) to FIG. 22(c) each shows a sectional structure after the gate insulating film 6 is formed. The gate insulating film 6 may be formed by either a thermal oxidation method or a deposition method. For example, in the case of using the thermal oxidation method, the substrate is heated to approximately 1100° C. under an oxygen atmosphere so that a silicon oxide film is formed at all the portions of the substrate where oxygen comes into contact. The gate insulating film 6 thus formed may be subjected to annealing at approximately 1000° C. under an atmosphere of nitrogen (N), argon (Ar) or N$_2$O in order to decrease an interfacial level at the interface between the well region 2 and the gate insulating film 6. Next, a material 23 of which the gate electrode 7 is formed is deposited thereon. FIG. 23(a) to FIG. 23(c) each show a sectional structure after deposition. The material 23 of which the gate electrode 7 is formed is commonly polysilicon, and the present embodiment is also illustrated with polysilicon. The polysilicon 23 may be deposited by a low pressure CVD method. The deposition thickness of the polysilicon 23 is set to be greater than half of the width of the gate groove 8 so as to fill the gate groove 8 completely with the polysilicon 23. For example, when the width of the gate groove 8 is 2 μm, the deposition thickness of the polysilicon 23 is greater than 1 μm. The deposited polysilicon 23 is then subjected to annealing in POCl$_3$ at 950° C. so as to form the n-type polysilicon 23 and provide the gate electrode 7 with electric conductivity. Next, the polysilicon 23 other than the gate electrode 7 is subjected to etching. The etching performed may be either isotropic etching or anisotropic etching. The etching amount is set such that the polysilicon 23 remains in the gate groove 8. For example, when the width c of the gate groove 8 is 2 μm, and the polysilicon is deposited with the thickness of 1.5 μm, the etching amount is preferably 1.5 μm. However, several percent of overetching with respect to the polysilicon with the thickness of 1.5 μm is a permissible level for etching control. FIG. 24(a) to FIG. 24(c) each show a sectional structure after the polysilicon 23 is subjected to etching and the gate electrode 7 is formed.

Next, the interlayer insulating film 10 and contact holes for forming electrodes are formed. FIG. 25(a) to FIG. 25(c) each show a sectional structure after the interlayer insulating film 10 is formed. FIG. 26 shows the positions of the contact holes 11 as viewed from above. FIG. 26 does not show the interlayer insulating film 10 for convenience of explanation. The interlayer insulating film 10 is generally preferably a silicon oxide film and may be deposited by a thermal CVD method or a plasma CVD method. After the interlayer insulating film 10 is deposited, the contact holes are formed. A resist is applied on the interlayer insulating film 10 and then patterned by common photolithography. The patterned resist is used as a mask so as to subject the interlayer insulating film 10 to etching. The etching performed may be wet etching using hydrofluoric acid or dry etching such as reactive ion etching (RIE). The resist is then removed by use of oxygen plasma or sulfuric acid. FIG. 27(a) to FIG. 27(c) each show a sectional structure after the contact holes are formed.

After the contact holes are formed, the electrical conducting layer 18, the electrical conducting layer 24 and the electrical conducting layer 25 are formed. The material commonly used for the electrical conducting layer 18, the electrical conducting layer 24 and the electrical conducting layer 25 is metal such as titanium (Ti), nickel (Ni) or molybdenum (Mo). The present embodiment exemplifies the case of using Ti. First, Ti is deposited. The deposition is preferably performed by, for example, MOCVD. Next, Ti is subjected to selective etching by use of a mask. The mask material is preferably a resist. FIG. 28(a) to FIG. 28(c) each show a sectional structure after etching, and FIG. 29 shows the entire surface structure thereof. FIG. 29 does not show the interlayer insulating film 10 for convenience of explanation. Thereafter, the gate wiring, the source wiring and the drain wiring are formed (not shown in the drawings) in the same manner as in the first embodiment. Accordingly, the semiconductor device according to the second embodiment shown in FIG. 12 is completed through the above-described steps.

According to the second embodiment, since the gate groove 8, the source groove 17 and the drain groove 20 can be formed simultaneously in the first step, the manufacture costs can be reduced. In addition, since only one mask is required in the first step, there is little concern about misalignment caused by the mask, so that the semiconductor device can be manufactured with high reliability as compared with the case where the respective grooves are formed individually.

Further, the gate groove 8, the source groove 17 and the drain groove 20 are formed in a manner such that the width a of the source groove 17 is greater than the width b of the drain groove 20, and the width b of the drain groove 20 is greater than the width c of the gate groove 8. Immediately after the gate groove 8, the source groove 17 and the drain groove 20 are formed while the mask 9 still remains, the mask material 21 is deposited with the thickness of one half or more of the width c of the gate groove 8 and one half or less of the width b of the drain groove 20 in the second step. Since only the gate groove 8 is filled completely with the mask material 21, the mask can be formed to perform ion injection on the source region 3 and the drain region 5 by self-alignment. Accordingly, the semiconductor device can be manufactured with high reliability but little concern about misalignment derived from the mask.

Further, in the third step, the source region 3 and the drain region 5 can be formed simultaneously on the side walls or the bottom surfaces of the source groove 17 and the drain groove 20 in a manner such that the n-type impurities are injected thereto by oblique ion injection. Therefore, the source region 3 and the drain region 5 can be formed simultaneously at predetermined portions only by single injection, so as to reduce costs as compared with the conventional manufacturing method. In addition, since no mask is used, the semiconductor device can be manufactured with high reliability but no concern about misalignment.

Further, in the fourth step of forming the mask material 22 for forming the well region 2, the thickness of the mask 22 is set such that the drain groove 20 is completely filled therewith and the source groove 17 is still provided with a space. Therefore, the mask material 22 can be formed by self-alignment without photolithography performed. Accordingly, the semiconductor device can be manufactured with high reliability but no concern about misalignment derived from the mask.

Further, in the fifth step, the well region 2 can be formed on the side walls and the bottom surface of the source groove 17 to surround the source region 3 in a manner such that the p-type impurities are injected thereto by oblique ion injection. Since no mask is used, the semiconductor device can be manufactured with high reliability but no concern about misalignment, as compared with the conventional manufacturing method.

Further, in the sixth step, the p-type impurities are injected to the substrate 1 by vertical ion injection to form the well contact region 19. The injection depth is deeper than the source region 3 in contact with the bottom of the source groove 17, and the impurity concentration is higher than that in the source region 3 in contact with the bottom of the source groove 17. Therefore, the well contact region 19 can be formed by self-alignment with no mask used. Accordingly, the semiconductor device can be manufactured with high reliability but no concern about misalignment.

Here, after the fifth step is performed, the p-type impurities may be injected by ion injection to form the well contact region 19 without the mask material 21 or the mask material 22 removed in the sixth step. The concentration of the p-type impurities injected is at least twice as much as the impurity concentration of the source region 3, and the injection depth is set to be greater than the total thickness of the mask material 21, the mask material 22 and the source region 3 and shallower than the well region 2. Accordingly, the step of removing the mask material 21 and the mask material 22 can be omitted so as to provide the semiconductor device manufactured at low cost.

In addition, in the sixth step, instead of the ion injection performed in the state where the source region 3 still remains on the bottom of the source groove 17 exposed by the anisotropy dry etching after the cross-sectional structure shown in FIG. 20(a) to FIG. 20(c) is formed, the p-type impurities may be injected by vertical ion injection after the source region 3 is removed so as to form the well contact region 19. Since the source region 3 is removed, there is no need to consider the relationship between the injection concentration and the impurity concentration of the source region 3. Furthermore, the injection depth is only required to be shallower than the well region 2. Since the cost of ion injection for forming the well contact region 19 varies depending on the impurity concentration and depth, which are not restricted any longer, the well contact region 19 can be formed at low cost.

Third Embodiment

A third embodiment of the present invention modifies the structure of the substrate 1 according to the first embodiment of the present invention. The semiconductor device according to the third embodiment includes an n$^+$-type rear surface electrical conducting region 26 with a high impurity concentration formed on one main surface (rear surface) of the substrate 1 opposite to the other main surface in contact with the drift region 4, as shown in FIG. 30. The drain region 5 is formed to extend from the second main surface of the drift region 4 toward the rear surface electrical conducting region 26 in the direction perpendicular to the second main surface of the drift region 4. A main surface (rear surface) of the rear surface electrical conducting region 26 opposite to another main surface in contact with the substrate 1 is electrically connected to the drain wiring 14.

The other configurations of the semiconductor device according to the third embodiment of the present invention are the same as those according to the first embodiment. The other configurations of the semiconductor device according to the third embodiment may be the same as those according to the second embodiment instead of those according to the first embodiment. The operation of the semiconductor device according to the third embodiment of the present invention is the same as that of the semiconductor device according to the first embodiment.

According to the third embodiment of the present invention, the edge of the well region 2 extends to the inside of the substrate 1 so as to significantly reduce an electric field concentration caused at the edge of the well region 2 and prevent a decrease in voltage resistance. Further, since the edge of the well region 2 extends to the inside of the substrate 1, and the impurity concentration of the substrate 1 is lower than that of the drift region 4, a breakdown voltage between the substrate 1 and the well region 2 is greater than that between the drift region 4 and the well region 2 when the drift region 4 and the substrate 1 have the same length in the direction parallel to the second main surface of the drift region 4. Accordingly, the voltage resistance can be further improved as compared with the structure described in Japanese Patent Unexamined Publication No. 2001-274398.

Further, since the substrate 1 is a semi-insulating substrate or an insulating substrate, the edge of the well region 2 is formed in an insulating region. Thus, the voltage resistance of the edge of the well region 2 can greatly be increased so that the semiconductor device having high voltage resistance can be ensured.

Further, since the material used for the substrate 1 is silicon carbide exerting high insulating performance and having high heat conductivity, the substrate 1 with the rear surface adhered to a cooling system via an electrical conducting material can efficiently radiate heat caused by a current generated when the semiconductor device is turned on so as to cool the semiconductor device efficiently. In addition, since silicon carbide is a semiconductor having a wide bandgap and has a low intrinsic carrier concentration, a semiconductor device effectively exerting high insulating performance and having high voltage resistance can be provided.

Further, since the rear surface electrical conducting region 26 having the same conductivity type (n-type) as the drain region 5 is formed on the rear surface of the substrate 1, and the drain region 5 is in contact with the rear surface electrical conducting region 26, drain electrodes (not shown in the drawing) can be provided on the rear surface of the substrate 1. Therefore, the gate electrodes 7 and source electrodes (not shown in the drawing) can be provided on the front surface of the semiconductor device, and the drain electrodes (not shown in the drawing) can be provided on the rear surface of the semiconductor device. Accordingly, the area of the drain wiring 14 connected to the drain electrodes (not shown in the drawing) can be maximized so as to conform to a chip area of the semiconductor device, and resistance at wiring portions can be reduced. Further, a stray capacitance between the drain wiring 14 and the source wiring 13 and between the drain wiring 14 and the gate wiring can greatly be reduced, as compared with the wiring structure shown in FIG. 7. Accordingly, the semiconductor device with a loss reduced can be ensured.

With regard to a method of manufacturing the semiconductor device according to the third embodiment of the present invention, the n$^+$-type rear surface electrical conducting region 26 with a high impurity concentration is formed preferably in a manner such that ions are injected on the rear surface of the substrate 1. The injection concentration is preferably in a range of $1\times10^{18}$ to $1\times10^{21}$ cm$^{-3}$. The injection depth is not particularly limited and may be determined as appropriate. Further, the drain wiring 14 may be formed in the same manner as in the first embodiment. Although not shown in the drawing, the drain region 5 may be provided with a drain groove as in the case of the second embodiment.

Other Embodiment

Although the present invention has been described above by way of the first to third embodiments, the present invention should not be deemed to be limited to the descriptions and the drawings composing part of the disclosure. It will be apparent to those skilled in the art from the disclosure that various alternative embodiments, examples and implementations can be made.

For example, although the first to third embodiments exemplified the case of the semiconductor device including the substrate 1 formed of silicon carbide, the material used for the substrate 1 is not limited to silicon carbide. The material used for the substrate 1 may be, for example, a semiconductor having a wide bandgap. Examples of the semiconductor having a wide bandgap include gallium nitride (GaN), diamond, zinc oxide (ZnO), and aluminum gallium nitride (AlGaN).

Although the first to third embodiments exemplified the case where n-type polysilicon is used for the gate electrode 7, p-type polysilicon may be used instead. Alternatively, the gate electrode 7 may be formed of other semiconductor materials or other electrical conducting materials such as metal materials. The material used for the gate electrode 7 may be p-type polysilicon carbide, silicon germanium (SiGe), or aluminum (Al).

Although the first to third embodiments exemplified the case where a silicon oxide film is used for the gate insulating film 6, a silicon nitride film may be used instead, or a laminated body of a silicon oxide film and a silicon nitride film may also be used. When the gate insulating film 6 is a silicon nitride film, and isotropic etching is performed, the gate insulating film 6 may be subjected to the etching by, for example, cleaning with hot phosphoric acid at 160° C.

The material used for the source electrode 15 and the drain electrode 16 may be metal, an alloy of a semiconductor and metal, or other conductors. The metal material may be nickel (Ni), titanium (Ti), or molybdenum (Mo). The deposition method for such a metal material may be electron-beam chemical vapor deposition, metal organic chemical vapor deposition (MOCVD), or sputtering. The alloy of a semiconductor and metal may be nickel silicide (SiNi), tungsten silicide (SiW), or titanium silicide (TiSi). The deposition method for such an alloy may be sputtering. Alternatively, a nitride such as titanium nitride (TiN), tantalum nitride (TaN) and tungsten nitride (WN) may also be used. The semiconductor material used may be polysilicon, germanium (Ge), tin (Sn), or gallium arsenide (GaAs). The source electrode 15 and the drain electrode 16 can be provided with electric conductivity in a manner such that n-type impurities such as phosphorus (P), arsenic (As) or antimony or p-type impurities such as boron (B), aluminum (Al) or gallium (Ga) are injected by ion injection to the materials described above.

Although the first to third embodiments exemplified the MOSFET as the semiconductor device, the semiconductor devices according to the respective embodiments can also be applied to an insulated gate bipolar transistor (IGBT) or a thyristor.

The present invention can, of course, include various embodiments not described in this specification. Therefore, the scope of the present invention is defined only by the appropriate features according to the claims in view of the explanations made above.

REFERENCE SIGNS LIST

1 SUBSTRATE
2 WELL REGION
3 SOURCE REGION
4 DRIFT REGION
5 DRAIN REGION
6 GATE INSULATING FILM
7 GATE ELECTRODE
8 GATE GROOVE
9, 21, 22 MASK MATERIAL

10 INTERLAYER INSULATING FILM
11 CONTACT HOLE
12 GATE WIRING
13 SOURCE WIRING
14 DRAIN WIRING
15 SOURCE ELECTRODE
16 DRAIN ELECTRODE
17 SOURCE GROOVE
18, 24, 25 ELECTRICAL CONDUCTING LAYER
19 WELL CONTACT REGION
20 DRAIN GROOVE
23 POLYSILICON
26 REAR SURFACE ELECTRICAL CONDUCTING REGION

The invention claimed is:

1. A semiconductor device comprising:
a substrate essentially consisting of a uniform material composition having a first conductivity type;
a drift region, having the first conductivity type, formed on a first main surface of the substrate, formed of the uniform material composition of the substrate and having a higher impurity concentration than the substrate, a first main surface of the drift region in contact with and spanning the first main surface of the substrate, a second main surface of the drift region being opposite to and parallel to the first main surface of the drift region;
a well region, having a second conductivity type,
wherein the well region comprises of a top side, a bottom side, and two lateral sides that each meet the top side and the bottom side,
wherein the well region is formed in the drift region to extend from the second main surface of the drift region in a direction perpendicular to the second main surface of the drift region,
wherein the first main surface of the substrate is between the bottom side of the well region and the first main surface of the drift region such that the bottom side of the well region lies entirely inside of the substrate,
wherein the two lateral sides of the well region extend from the second main surface of the drift region to the bottom side of the well region,
wherein the two lateral sides of the well region intersect the first main surface of the substrate, and
wherein the well region spans the drift region in a direction parallel to the first main surface of the drift region;
a drain region, having the first conductivity type, formed in the drift region to be separated from the well region and extend from the second main surface of the drift region in a perpendicular direction;
a source region, having the first conductivity type, formed in the well region to extend from the second main surface of the drift region in the perpendicular direction;
a gate groove extending from the second main surface of the drift region in the perpendicular direction and penetrating the source region and the well region in a direction parallel to the second main surface of the drift region;
a gate electrode formed on a surface of the gate groove with a gate insulating film interposed therebetween;
a source electrode electrically connected to the source region and the well region; and
a drain electrode electrically connected to the drain region.

2. The semiconductor device according to claim 1, wherein the uniform material composition is essentially silicon carbide.

3. The semiconductor device according to claim 1, wherein the source region extends to the inside of the substrate in the perpendicular direction.

4. The semiconductor device according to claim 1, wherein the gate groove extends to the inside of the substrate in the perpendicular direction.

5. The semiconductor device according to claim 1, wherein the gate groove is deeper than the source region in the perpendicular direction.

6. The semiconductor device according to claim 1, wherein the gate groove is deeper than the well region in the perpendicular direction.

7. The semiconductor device according to claim 1, wherein the drain region extends to the inside of the substrate in the perpendicular direction.

8. The semiconductor device according to claim 1, further comprising a source groove formed in the source region to extend from the second main surface in the perpendicular direction.

9. The semiconductor device according to claim 8, wherein a width of the source groove is greater than a width of the gate groove.

10. The semiconductor device according to claim 1, further comprising a drain groove formed in the drain region to extend from the second main surface in the perpendicular direction.

11. The semiconductor device according to claim 10, wherein a width of the drain groove is greater than a width of the gate groove.

12. The semiconductor device according to claim 1, further comprising: a source groove formed in the source region to extend from the second main surface in the perpendicular direction; and a drain groove formed in the drain region to extend from the second main surface in the perpendicular direction.

13. The semiconductor device according to claim 12, wherein a width of the source groove is greater than a width of the drain groove, and the width of the drain groove is greater than a width of the gate groove.

14. The semiconductor device according to claim 8, wherein:
a bottom of the source groove is in contact with the substrate;
the semiconductor device further comprises a well contact region, having the second conductivity type, formed on the bottom of the source groove and in contact with the well region; and
the well contact region, the source region and the well region have an identical potential.

15. The semiconductor device according to claim 1, further comprising a rear surface electrical conducting region, having the first conductivity type, formed on a second main surface of the substrate opposite to the first main surface of the substrate, wherein the drain region penetrates the substrate in the perpendicular direction and extends to the rear surface electrical conducting region.

* * * * *